(12) United States Patent
Lee et al.

(10) Patent No.: US 12,193,210 B2
(45) Date of Patent: Jan. 7, 2025

(54) METHOD OF FORMING A WIRING AND METHOD OF MANUFACTURING A SEMICONDUCTOR DEVICE USING THE SAME

(71) Applicant: SAMSUNG ELECTRONICS CO., LTD., Suwon-si (KR)

(72) Inventors: Hyunchul Lee, Hwaseong-si (KR); Kijeong Kim, Hwaseong-si (KR); Jongcheon Kim, Seoul (KR); Donghwi Shin, Yongin-si (KR); Hyunsil Hong, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 468 days.

(21) Appl. No.: 17/719,622

(22) Filed: Apr. 13, 2022

(65) Prior Publication Data
US 2023/0035456 A1    Feb. 2, 2023

(30) Foreign Application Priority Data
Jul. 27, 2021    (KR) .................. 10-2021-0098353

(51) Int. Cl.
*H10B 12/00*    (2023.01)
*H01L 21/027*    (2006.01)
*H01L 21/311*    (2006.01)

(52) U.S. Cl.
CPC ..... *H10B 12/0335* (2023.02); *H01L 21/0274* (2013.01); *H01L 21/31111* (2013.01); *H01L 21/31144* (2013.01); *H10B 12/482* (2023.02)

(58) Field of Classification Search
None
See application file for complete search history.

(56) References Cited

U.S. PATENT DOCUMENTS

| | | | |
|---|---|---|---|
| 7,812,455 B2 | 10/2010 | King et al. | |
| 9,647,015 B2 | 5/2017 | Deng | |
| 9,659,856 B2 | 5/2017 | Lee et al. | |
| 9,799,605 B2 | 10/2017 | Edelstein et al. | |
| 10,777,456 B1 | 9/2020 | Aizawa et al. | |
| 10,886,139 B2 | 1/2021 | Goupil et al. | |
| 2007/0006451 A1* | 1/2007 | Lee ................... | H01L 21/32139 257/E21.314 |
| 2011/0175233 A1 | 7/2011 | Ueki | |
| 2018/0286867 A1* | 10/2018 | Chang ............... | H01L 21/76843 |
| 2018/0315601 A1* | 11/2018 | Peng ................. | H01L 21/3088 |
| 2020/0251337 A1* | 8/2020 | Chen ................ | H01L 21/31144 |

FOREIGN PATENT DOCUMENTS

JP    1995-106324 A    4/1995

* cited by examiner

*Primary Examiner* — Khaja Ahmad
(74) *Attorney, Agent, or Firm* — Muir Patent Law, PLLC

(57) ABSTRACT

In a method of forming a wiring, an insulating interlayer including a low-k dielectric material is formed on a substrate. A first etching mask is formed on the insulating interlayer. A first etching process is performed using the first etching mask to form a first opening through the insulating interlayer. The first etching mask is removed. A protection pattern is formed on a bottom and a side of the first opening. A second etching mask is formed on the protection pattern and the insulating interlayer. A second etching process is performed using a second etching mask to form a second opening through the insulating interlayer. The second etching mask is removed. The protection pattern is removed. A wiring is formed in each of the first and second openings.

20 Claims, 23 Drawing Sheets

FIG. 16
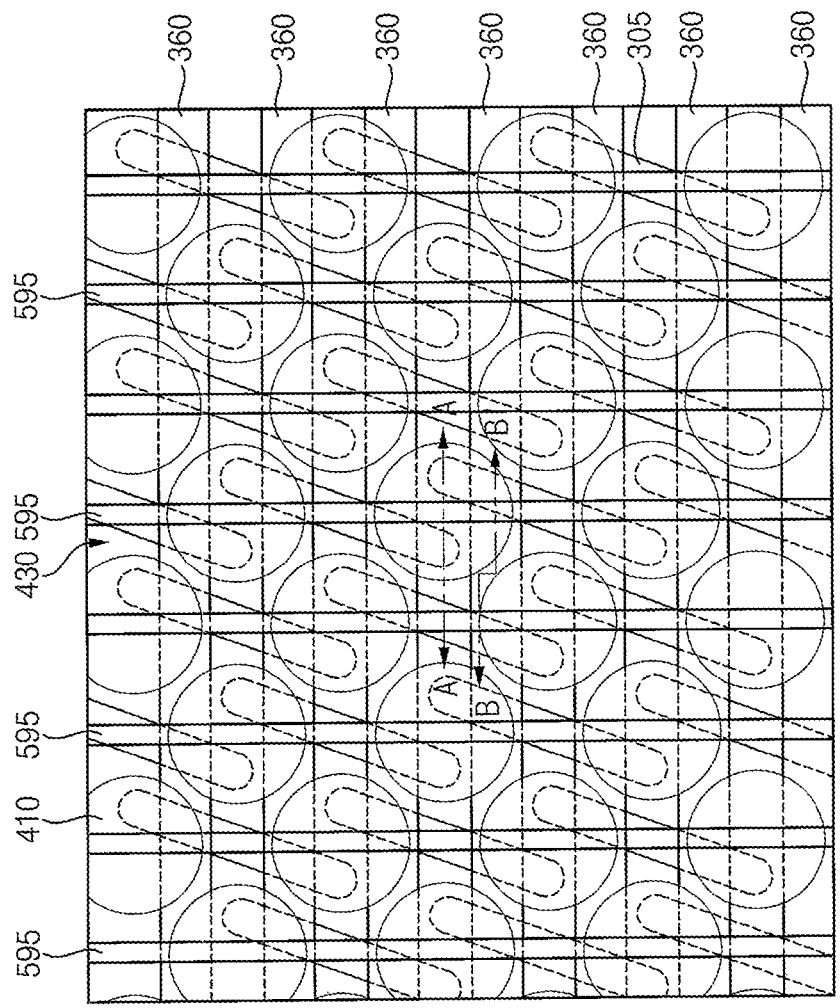
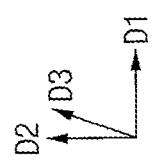

METHOD OF FORMING A WIRING AND METHOD OF MANUFACTURING A SEMICONDUCTOR DEVICE USING THE SAME

CROSS-REFERENCE TO RELATED APPLICATION

This application claims priority under 35 U.S.C. § 119 to Korean Patent Application No. 10-2021-0098353, filed on Jul. 27, 2021, in the Korean Intellectual Property Office, the disclosure of which is hereby incorporated by reference in its entirety.

BACKGROUND

1. Field

Example embodiments of the present disclosure relate to a method of forming a wiring and a method of manufacturing a semiconductor device using the same.

2. Description of Related Art

As the integration degree of a dynamic random-access memory (DRAM) device increases, distances between wirings may decrease. Thus, a fabrication process for effectively forming a plurality of wirings is needed.

SUMMARY

According to example embodiments, a method of forming a wiring may be provided. In the method, an insulating interlayer including a low-k dielectric material may be formed on a substrate. A first etching mask may be formed on the insulating interlayer. A first etching process may be performed using the first etching mask to form a first opening through the insulating interlayer. The first etching mask may be removed. A protection pattern may be formed on a bottom and a side of the first opening. A second etching mask may be formed on the protection pattern and the insulating interlayer. A second etching process may be performed using a second etching mask to form a second opening through the insulating interlayer. The second etching mask may be removed. The protection pattern may be removed. A wiring may be formed in each of the first and second openings.

According to example embodiments, a method of forming a wiring may be provided, In the method, an insulating interlayer may be formed on a substrate. A first etching mask may be formed on the insulating interlayer. A first etching process may be performed using the first etching mask to form first openings to be spaced apart from each other through the insulating interlayer. The first etching mask may be removed by an ashing process. A protection pattern may be formed on a bottom and a side of each of the first openings. A second etching mask may be formed on the protection pattern and the insulating interlayer. A second etching process may be performed using a second etching mask to form a second opening between the first openings through the insulating interlayer. The second etching mask may be removed by an ashing process. The protection pattern may be removed. A wiring may be formed in each of the first and second openings.

According to example embodiments, a method of manufacturing a semiconductor device may be provided. In the method, a buried gate structure may be formed in an upper portion of a substrate. A bit line structure may be formed on the substrate. A contact plug structure may be formed to be adjacent to the bit line structure on the substrate. A capacitor may be formed on the contact plug structure. A wiring may be formed to be electrically connected to the capacitor. When the wiring is formed, a first insulating interlayer including a low-k dielectric material may be formed on the capacitor. A first etching mask may be formed on the first insulating interlayer. A first etching process may be performed using the first etching mask to form a first opening through the first insulating interlayer. The first etching mask may be removed. A protection pattern may be formed on a bottom and a side of the first opening. A second etching mask may be formed on the protection pattern and the first insulating interlayer. A second etching process may be performed using a second etching mask to form a second opening through the first insulating interlayer. The second etching mask may be removed. The protection pattern may be removed. A wiring may be formed in each of the first and second openings.

BRIEF DESCRIPTION OF THE DRAWINGS

Features will become apparent to those of skill in the art by describing in detail exemplary embodiments with reference to the attached drawings, in which:

FIGS. 11 to 28 are plan views and cross-sectional views illustrating stages in a method of manufacturing a semiconductor device in accordance with example embodiments.

DETAILED DESCRIPTION

It will be understood that, although the terms "first," "second," and/or "third" may be used herein to describe various elements, components, regions, layers and/or sections, and these elements, components, regions, layers and/or sections should not be limited by these terms. These terms are only used to distinguish one element, component, region, layer or section from another region, layer or section. Thus, a first element, component, region, layer or section discussed below could be termed a second or third element, component, region, layer or section.

FIGS. 1 to 10 are cross-sectional views illustrating stages in a method of forming a wiring in accordance with example embodiments.

Figure 1:
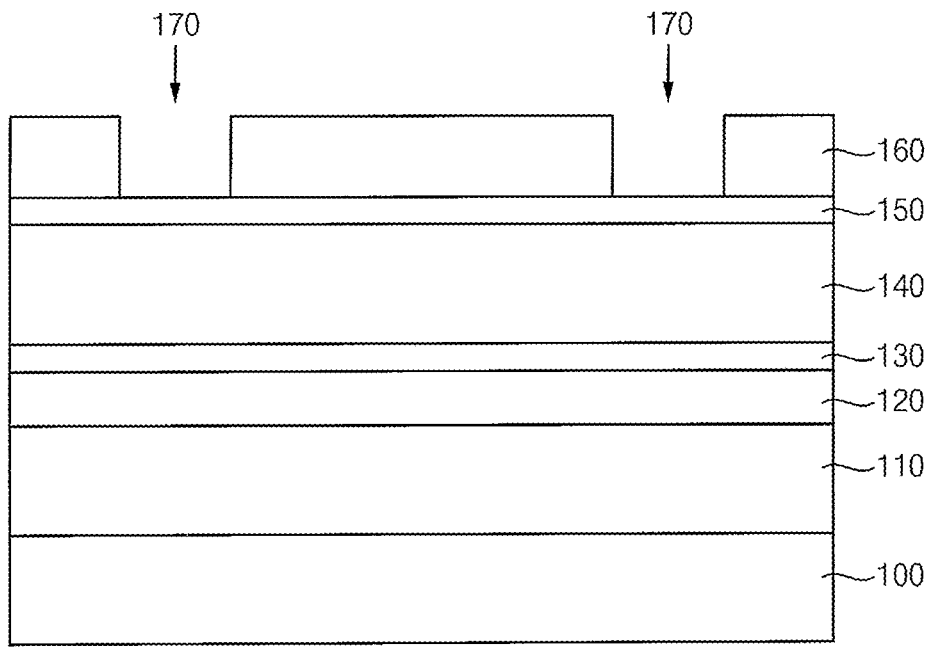
FIGS. 1 to 10 are cross-sectional views illustrating stages in a method of forming a wiring in accordance with example embodiments.

Referring to FIG. 1, a first insulating interlayer 110, a second insulating interlayer 120, a pad layer 130, a first mask layer 140, and a second mask layer 150 may be sequentially stacked on a substrate 100. A first photoresist pattern 160 may be formed on the second mask layer 150.

For example, the substrate 100 may include silicon, germanium, silicon-germanium, or a III-V group compound semiconductor, e.g., GaP, GaAs, or GaSb. In another example, the substrate 100 may be a silicon-on-insulator (SOI) substrate or a germanium-on-insulator (GOI) substrate.

For example, the first insulating interlayer 110 and the pad layer 130 may include silicon oxide, e.g., tetraethyl orthosilicate (TEOS), the second insulating interlayer 120 may include a low-k dielectric material, e.g., silicon oxycarbonitride, silicon oxynitride, silicon carbonitride, etc., the first mask layer 140 may include, e.g., spin-on hardmask (SOH)

or amorphous carbon layer (ACL), and the second mask layer 150 may include, e.g., plasma enhanced silicon oxynitride (PE-SiON).

The first photoresist pattern 160 may include a first opening 170 exposing an upper surface of the second mask layer 150. FIG. 1 shows that the first photoresist pattern 160 includes two first openings 170 spaced apart from each other, however, embodiments are not limited thereto, e.g., the first photoresist pattern 160 may include more than two first openings 170.

In example embodiments, the first photoresist pattern 160 may be formed by forming a first photoresist layer on the second mask layer 150, and performing an exposure process and a developing process on the first photoresist layer. The exposure process and the developing process may be performed by an argon fluoride (ArF) photolithography process using ArF laser equipment. However, embodiments are not limited thereto, e.g., the exposure process and the developing process may be performed by extreme ultraviolet (EUV) photolithography process using EUV equipment.

Figure 2:
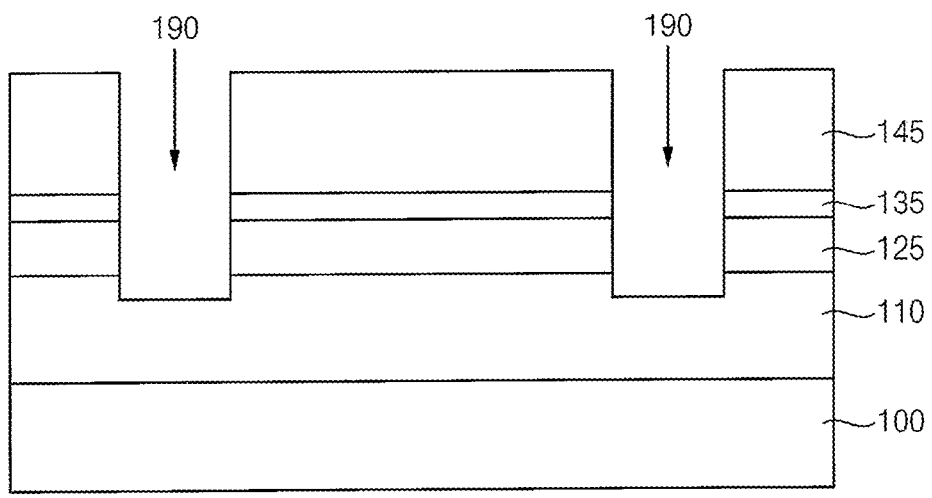

Referring to FIG. 2, the second mask layer 150 may be patterned by an etching process using the first photoresist pattern 160 as an etching mask to form a second mask, and the first mask layer 140 may be patterned by an etching process using the second mask as an etching mask to form a first mask 145. The pad layer 130 and the second insulating interlayer 120 may be patterned by an etching process using the first mask 145 as an etching mask to form a pad 135 and a second insulating interlayer pattern 125, respectively, and the first photoresist pattern 160 and the second mask may be removed during the etching mask process.

By the etching process, a second opening 190 exposing an upper surface of the first insulating interlayer 110 may be formed. In some embodiments, the second opening 190 may partially extend through an upper portion of the first insulating interlayer 110.

Figure 3:
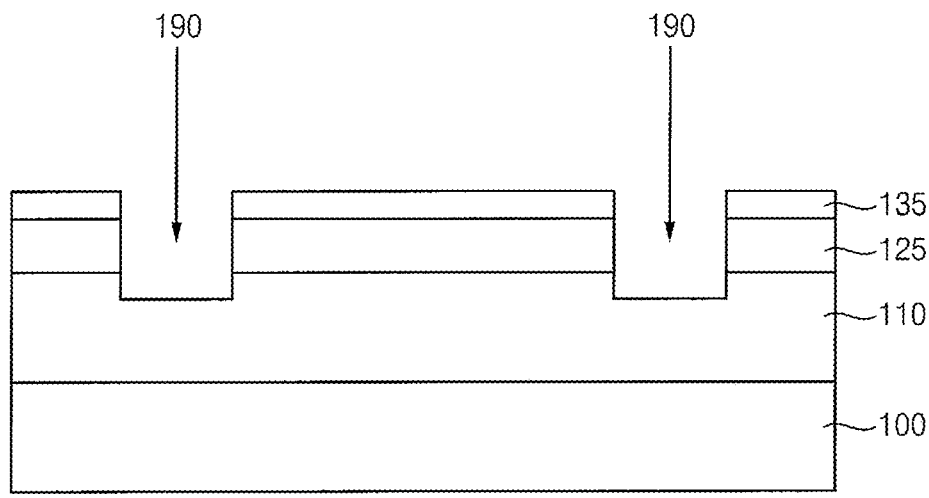

Referring to FIG. 3, the first mask 145 may be removed. In example embodiments, the first mask 145 may be removed by an ashing process and/or a stripping process.

In an example embodiment, the ashing process and/or the stripping process may be performed using oxygen plasma, nitrogen plasma and argon plasma. Alternatively, the ashing process and/or the stripping process may be performed using hydrogen plasma and nitrogen plasma.

Figure 4:
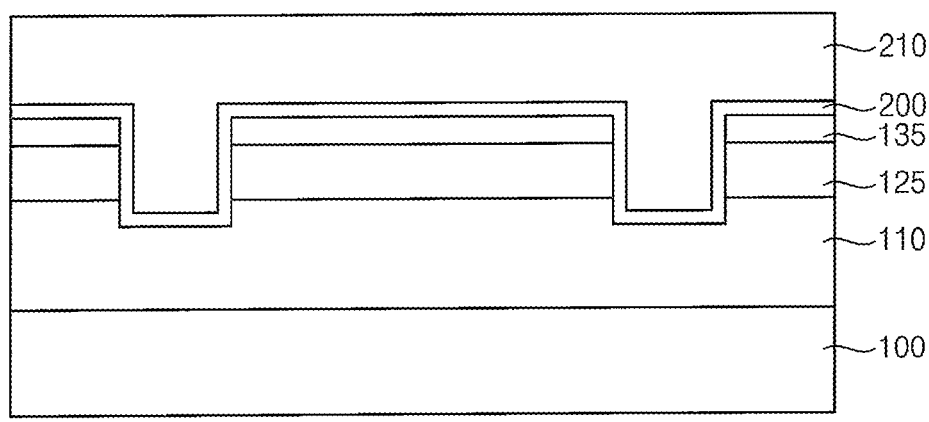

Referring to FIG. 4, a protection layer 200 may be conformally formed on a side and a bottom of the second opening 190 and an upper surface of the pad 135. A filling layer 210 may be formed on the protection layer 200 to fill a remaining portion of the second opening 190.

In example embodiments, the protection layer 200 may include a metal nitride, e.g., aluminum nitride, tantalum nitride, titanium nitride, tungsten nitride, etc. The filling layer 210 may include, e.g., SOH, ACL, etc.

Figure 5:
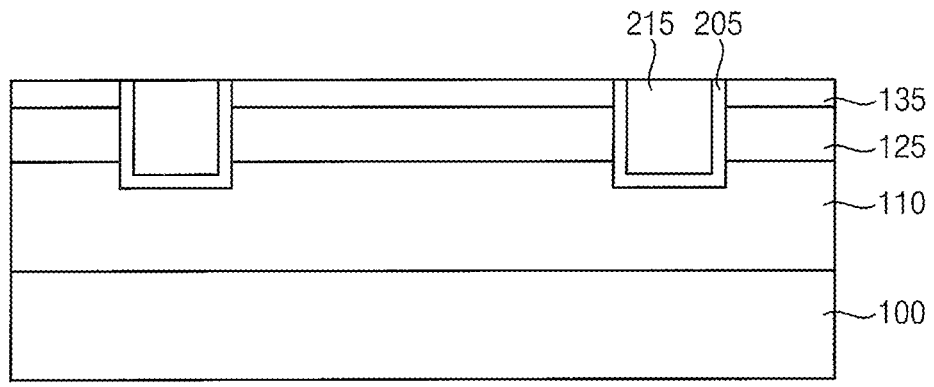

Referring to FIG. 5, the filling layer 210 may be planarized until an upper surface of the protection layer 200 is exposed, and an exposed portion of the protection layer 200 may be removed, e.g., portions of the protection layer 200 covering an upper surface of the pad 135 may be removed. Thus, a protection pattern 205 may be formed on the side and the bottom of the second opening 190. A filling pattern 215 may fill the remaining portion of the second opening 190, and an upper surface of the pad 135 may be exposed.

In example embodiments, the planarization process may be performed by a dry etching process, e.g., an etch back process. The exposed upper portion of the protection layer 200 may be removed by, e.g., a wet etching process.

Figure 6:
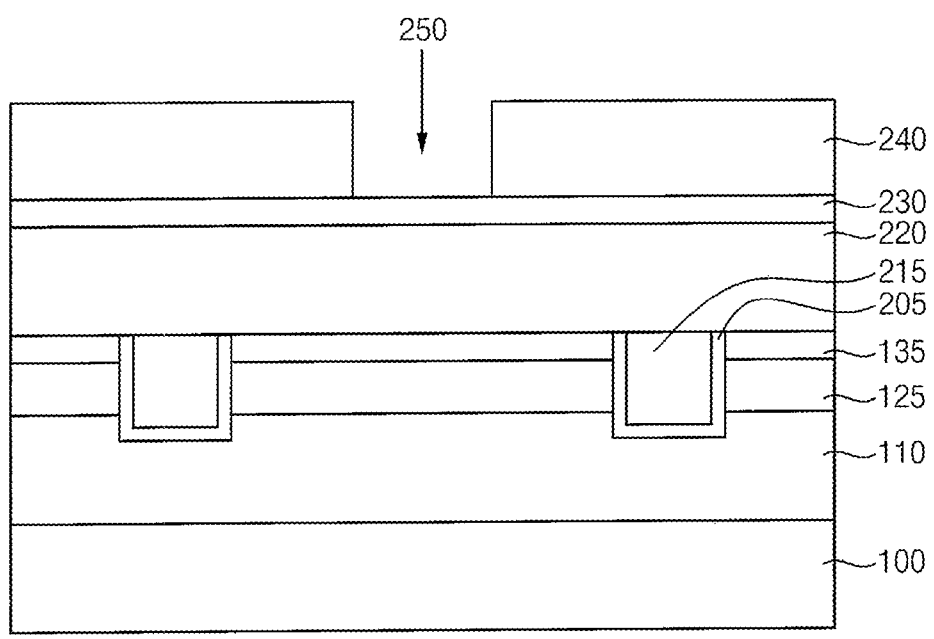

Referring to FIG. 6, a third mask layer 220 may be formed on the exposed upper surface of the pad 135, an upper surface of the protection pattern 205, and an upper surface of the filling pattern 215. A fourth mask layer 230 may be formed on the third mask layer 220, and a second photoresist pattern 240 may be formed on the fourth mask layer 230.

The third mask layer 220 may include, e.g., SOH, ACL, etc., and thus, in some embodiments, may be merged with the filling pattern 215. The fourth mask layer 230 may include, e.g., PE-SiON.

The second photoresist pattern 240 may include a third opening 250 exposing an upper surface of the fourth mask layer 230. In example embodiments, the third opening 250 may not overlap the second opening 190 (in which the filling pattern 215 and the protection pattern 205 are formed) in a vertical direction substantially perpendicular to an upper surface of the substrate 100. Thus, the third opening 250 may be formed between the second openings 190 in a plan view.

In an example embodiment, a width of the third opening 250 may be different from a width of the first opening 170, and FIG. 6 shows that the width of the third opening 250 is greater than the width of the first opening 170.

The second photoresist pattern 240 may also be formed by forming a second photoresist layer on the fourth mask layer 230, and performing an exposure process and a developing process on the second photoresist layer, like the method of forming the first photoresist pattern 160. The exposure process and the developing process may be performed by an ArF photolithography process or an EUV photolithography process.

Figure 7:
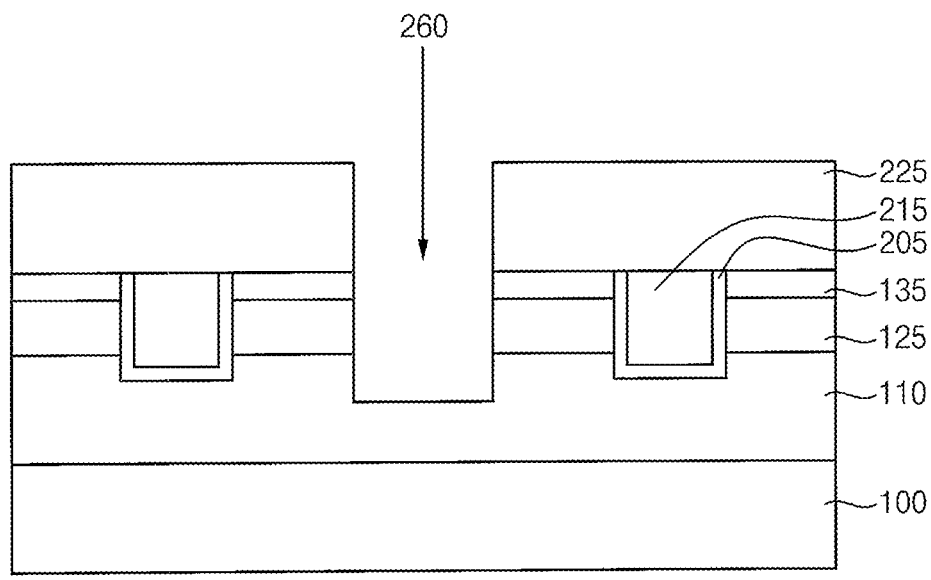

Referring to FIG. 7, the fourth mask layer 230 may be patterned by an etching process using the second photoresist pattern 240 as an etching mask to form a fourth mask, and the third mask layer 220 may be patterned by an etching mask using the fourth mask as an etching mask to form a third mask 225. The pad 135 and the second insulating interlayer pattern 125 may be patterned using the third mask 225 as an etching mask, and the second photoresist pattern 240 and the fourth mask may be removed during the etching process.

By the etching process, a fourth opening 260 may be formed to expose an upper surface of the first insulating interlayer 110, and in some embodiments, the fourth opening 260 may partially extend through an upper portion of the first insulating interlayer 110. The fourth opening 260 may be formed between the second openings 190 in which the filling pattern 215 and the protection pattern 205 are formed.

In an example embodiment, a bottom of the fourth opening 260 may have a height different from the bottom of the second opening 190 (in which the filling pattern 215 and the protection pattern 205 are formed). FIG. 7 shows that the bottom of the fourth opening 260 is lower than the bottom of the second opening 190. However, embodiments are not limited thereto, e.g., the bottom of the fourth opening 260 may be higher or substantially coplanar with the bottom of the second opening 190.

Figure 8:
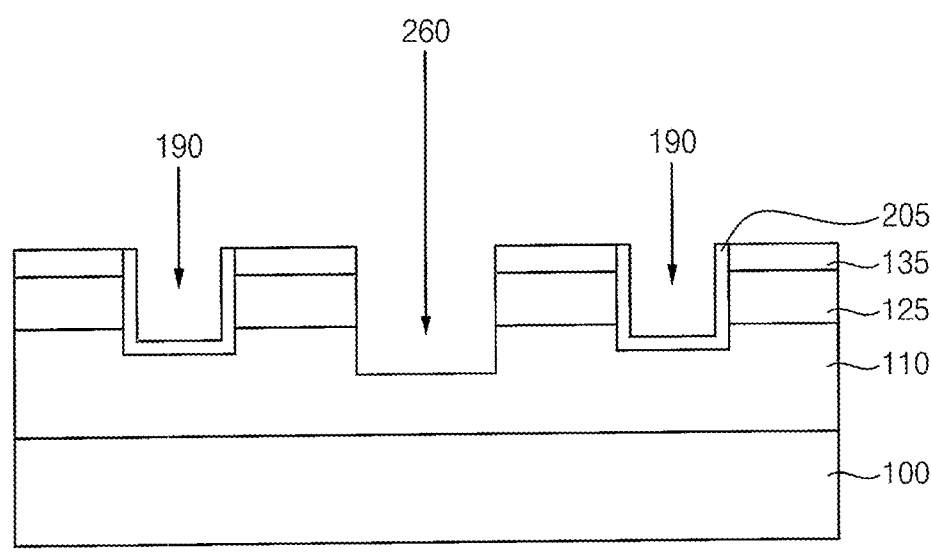

Referring to FIG. 8, the third mask 225 may be removed, and the filling pattern 215 may also be removed. In example embodiments, the third mask 225 and the filling pattern 215 may be removed by, e.g., an ashing process and/or a stripping process, as the process for removing the first mask 145. As the third mask 225 and the filling pattern 215 are removed, the pad 135 and the protection pattern 205 may be exposed, and the second opening 190 may be partially formed.

Figure 9:
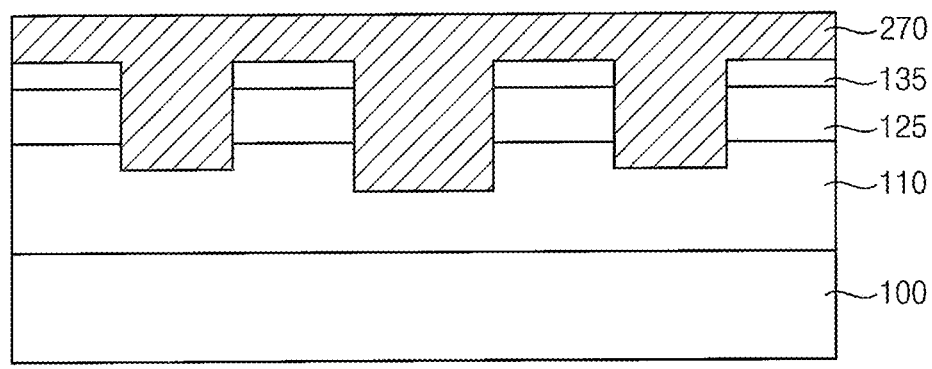

Referring to FIG. 9, the protection pattern 205 may be removed, and thus the upper surface of the first insulating interlayer 110 and sidewalls of the second insulating interlayer pattern 125 and the pad 135 may be exposed. In example embodiments, the protection pattern 205 may be removed by a wet etching process.

A conductive layer 270 may be formed on the pad 135 and the first insulating interlayer 110 to fill the second and fourth openings 190 and 260. The conductive layer 270 may include a metal, e.g., copper, aluminum, tungsten, etc., a metal nitride, doped polysilicon, or a combination thereof.

Figure 10:
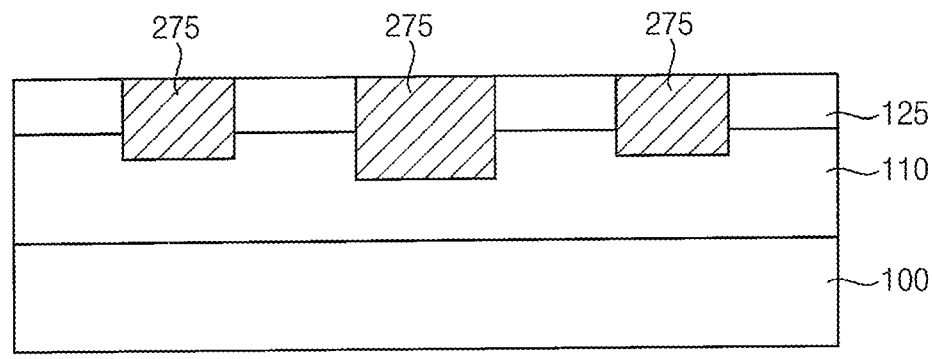

Referring to FIG. 10, the conductive layer 270 may be planarized until an upper surface of the second insulating interlayer pattern 125 is exposed to form a wiring 275 in each of the second and fourth openings 190 and 260. In example embodiments, the planarization process may be performed by a chemical mechanical polishing (CMP) process and/or an etch back process, and the pad 135 may also be removed during the planarization process. The wiring 275 may be formed in the second insulating interlayer pattern 125 including a low-k dielectric material by the above processes.

As the integration degree of the device increases, distances between wirings may decrease. While an EUV photolithography process using EUV laser equipment has been offered to form a photoresist pattern that may be used in an etching process for forming the wirings with small distances therebetween, the EUV photolithography process needs expensive EUV laser equipment. Thus, the wirings 275 according to embodiments may be formed by performing an etching process twice via an ArF photolithography process, e.g., as opposed to performing a single etching process, in order to effectively form the wirings 275 spaced apart from each other by a short distance.

The etching masks used in the etching process, e.g., the first and third masks 145 and 225, may be removed by an ashing process and/or a stripping process using plasma, and portions of the second insulating interlayer pattern 125 exposed by the second and fourth openings 190 and 260 could potentially be damaged. Particularly, the second insulating interlayer pattern 125 including a low-k dielectric material containing carbon may be vulnerable to an ashing process using oxygen plasma, and as the number of exposures of the second insulating interlayer pattern 125 to the ashing process increases, the degree of the potential damage may increase.

However, in example embodiments, the protection pattern 205 protecting the side and the bottom of the second opening 190 may be formed, and thus the portion of the second insulating interlayer pattern 125 adjacent to the second opening 190 may not be damaged during the ashing process for removing the third mask 225. If the protection pattern 205 were not formed, the portion of the second insulating interlayer pattern 125 adjacent to the second opening 190 could have been damaged during both the ashing process for removing the first mask 145 and the ashing process for removing the third mask 225, which could have deteriorated the insulative characteristics of the second insulating interlayer pattern 125.

Further, in the method of forming the wiring 275 in accordance with example embodiments, the wirings 275 to be spaced apart from each other by short distances may be divided into a plurality of groups, and etching processes may be performed to form second and fourth openings 190 and 260, respectively. The protection pattern 205 may be formed on the side and the bottom of the second opening 190, which may be formed before the fourth opening 260, so that the second insulating interlayer pattern 125 including a low-k dielectric material may be affected by the ashing process only one time to decrease the damage degree. Accordingly, the second insulating interlayer pattern 125 containing the wiring 275 may have enhanced insulative characteristics.

In the method of forming the wiring in accordance with example embodiments, the openings for forming the wirings may be formed not only by a single etching process but by a plurality of etching processes, and thus the openings may have different widths and/or depths from each other so that the wirings in the openings, respectively, may also have different widths and/or depths from each other. For example, if the openings are formed by performing etching processes twice, and the openings formed by the respective etching processes are alternately disposed in a direction, the widths and/or depths of the openings may alternately change in the direction so that the widths and/or depths of the wirings in the openings, respectively, may alternately change in the direction.

FIGS. 11 to 28 are plan views and cross-sectional views illustrating stages in a method of manufacturing a semiconductor device in accordance with example embodiments. Particularly, FIGS. 11, 13, 16, 20, 23 and 25 are the plan views, and each of FIGS. 12, 14-15, 17-19, 21-22, 24 and 26-28 includes cross-sections taken along lines A-A' and B-B' of a corresponding plan view.

This method of manufacturing the semiconductor device is the application of the method of forming the wiring illustrated with reference to FIGS. 1 to 10 to a method of forming a DRAM device. Thus, repeated explanations on the formation of the wiring are omitted herein.

Hereinafter, in the specifications (but not necessarily in the claims), two directions substantially parallel to an upper surface of a substrate and substantially perpendicular to each other may be referred to as first and second directions D1 and D2, respectively, and a direction substantially parallel to the upper surface of the substrate and having an acute angle with respect to the first and second directions D1 and D2 may be referred to as a third direction D3.

Figure 11:
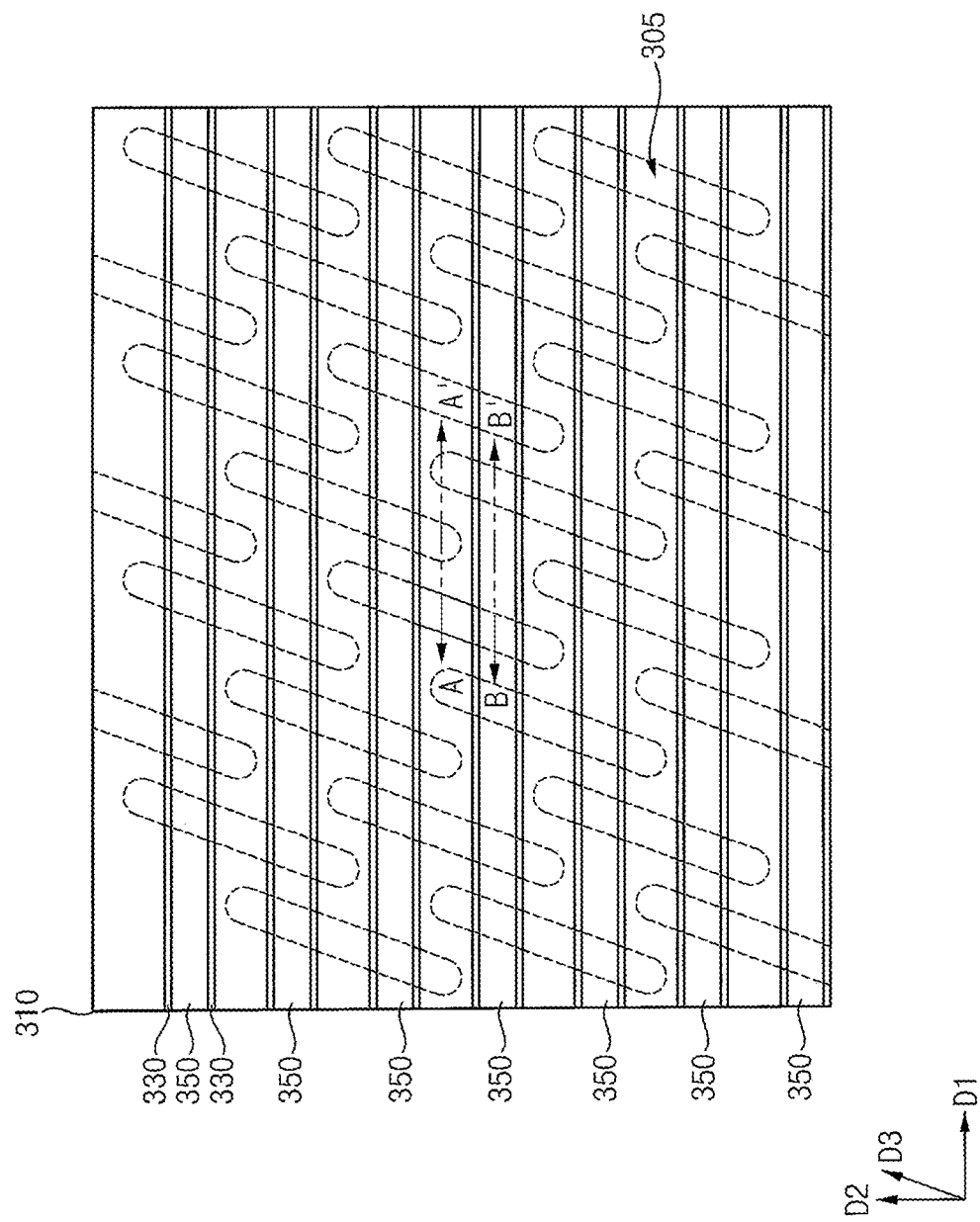
Figure 12:
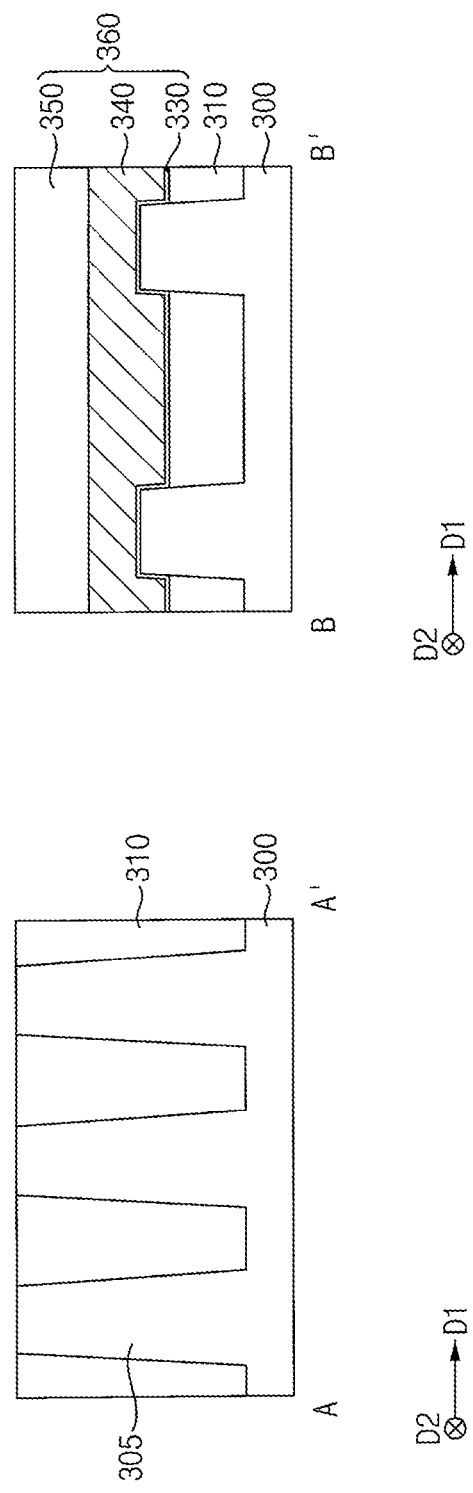

Referring to FIGS. 11 and 12, an upper portion of the substrate 300 may be removed to form a first recess, and an isolation pattern 310 may be formed to fill the first recess. As the isolation pattern 310 is formed on the substrate 300, an active pattern 305 of which a sidewall may be covered by the isolation pattern 310 may be defined. The active pattern 305 may extend in the third direction D3, and a plurality of active patterns 305 may be spaced apart from each other in the first and second directions D1 and D2. The isolation pattern 310 may include an oxide, e.g., silicon oxide.

The active pattern 305 and the isolation pattern 310 on the substrate 300 may be partially etched to form a second recess extending in the first direction D1, and a gate structure 360 may be formed in the second recess. The gate structure 360 may include a gate insulation pattern 330 on a bottom and a side of the second recess, a gate electrode 340 on a portion of the gate insulation pattern 330 on the bottom and a lower side of the second recess, and a gate mask 350 on the gate electrode 340 and filling an upper portion of the second recess. The gate insulation pattern 330 may include an oxide, e.g., silicon oxide, the gate electrode 340 may include, e.g., a metal, a metal nitride, a metal silicide, doped polysilicon, etc., and the gate mask 350 may include a nitride, e.g., silicon nitride.

In example embodiments, the gate structure 360 may extend in the first direction D1, and a plurality of gate structures 360 may be spaced apart from each other in the second direction D2.

Figure 13:
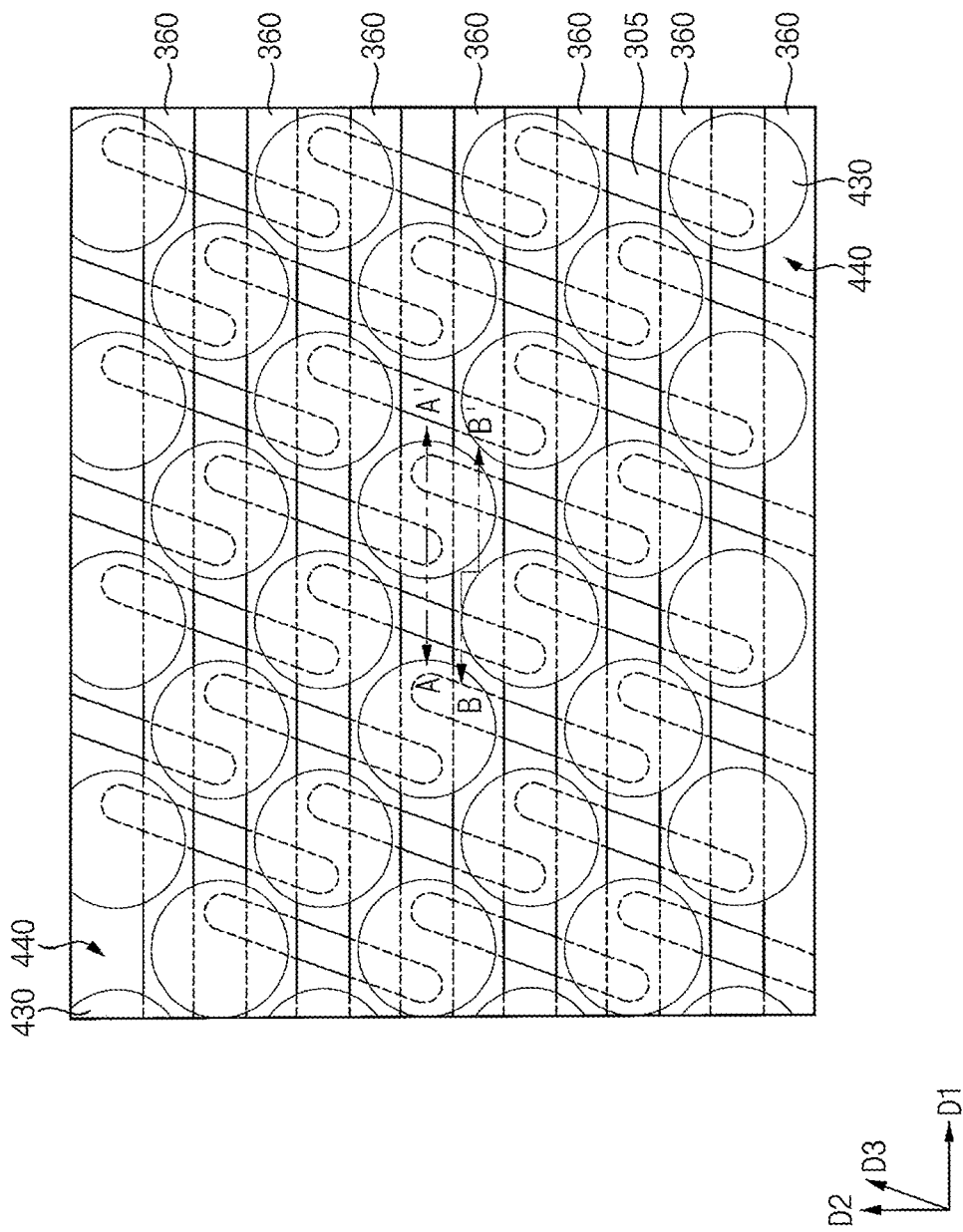
Figure 14:
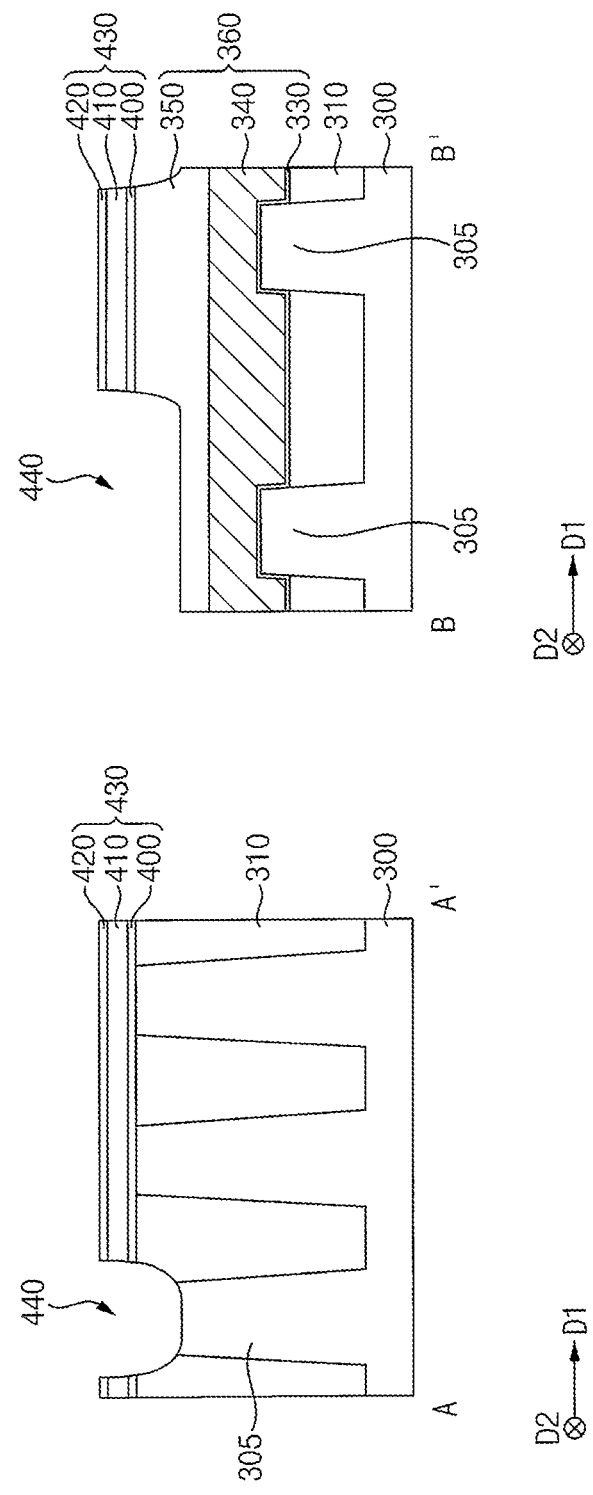

Referring to FIGS. 13 and 14, an insulation layer structure 430 may be formed on the active pattern 305, the isolation pattern 310, and the gate structure 360. The insulation layer structure 430 may include first, second and third insulation layers 400, 410 and 420 sequentially stacked. The first and third insulation layers 400 and 420 may include an oxide, e.g., silicon oxide, and the second insulation layer 410 may include a nitride, e.g., silicon nitride.

The insulation layer structure 430 may be patterned, and the active pattern 305, the isolation pattern 310, and the gate mask 350 included in the gate structure 360 may be partially etched using the patterned insulation layer structure 430 as an etching mask to form a fifth opening 440. In example embodiments, the insulation layer structure 430 remaining after the etching process may have a shape of a circle or an ellipse in a plan view, and a plurality of insulation layer structures 430 may be spaced apart from each other in the first and second directions D1 and D2. Each of the insulation layer structures 430 may overlap ends in the third direction D3 of neighboring ones of the active patterns 305 in a vertical direction substantially perpendicular to an upper surface of the substrate 300.

Figure 15:
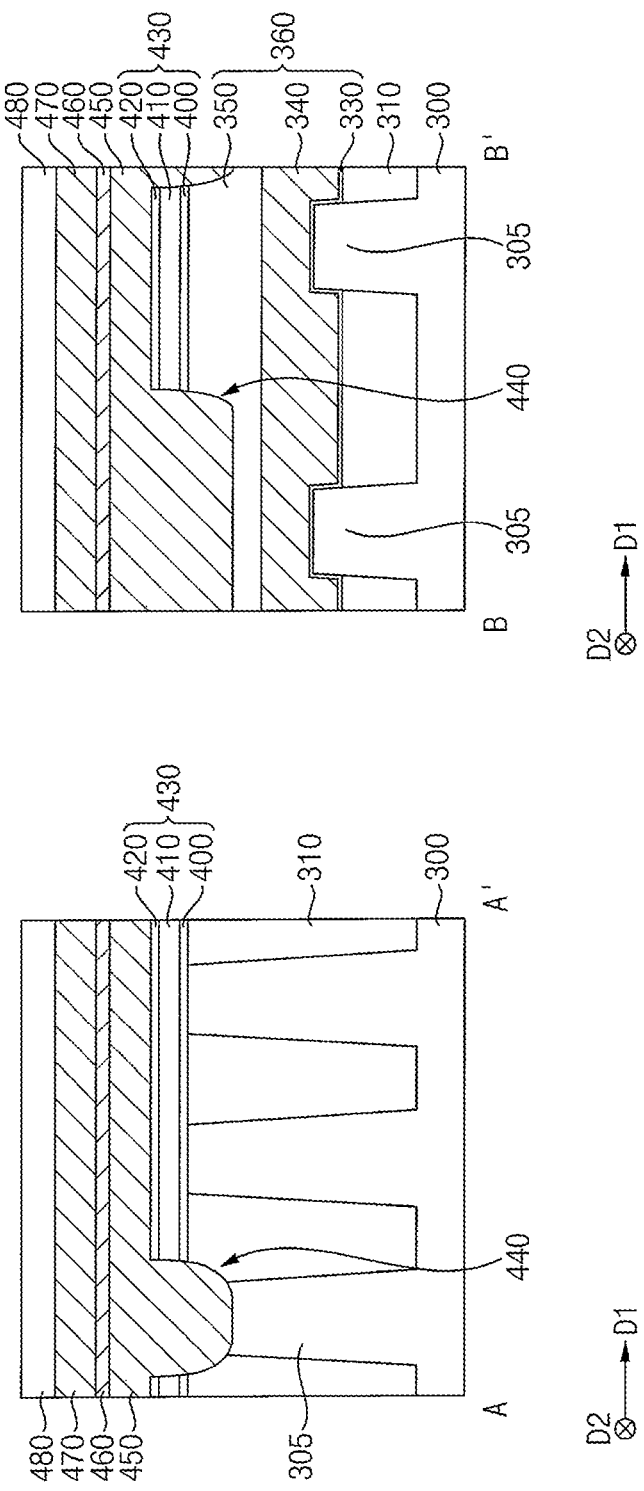

Referring to FIG. 15, a first conductive layer 450, a first barrier layer 460, a second conductive layer 470, and a fifth mask layer 480 may be sequentially stacked on the insulation layer structure 430, the active pattern 305 exposed by the fifth opening 440, the isolation pattern 310, and the gate structure 360, which may form a conductive layer structure. The first conductive layer 450 may fill the fifth opening 440.

The first conductive layer 450 may include, e.g., doped polysilicon, the first barrier layer 460 may include a metal silicon nitride, e.g., titanium silicon nitride, the second conductive layer 470 may include a metal, e.g., tungsten, and the fifth mask layer 480 may include a nitride, e.g., silicon nitride.

Figure 17:
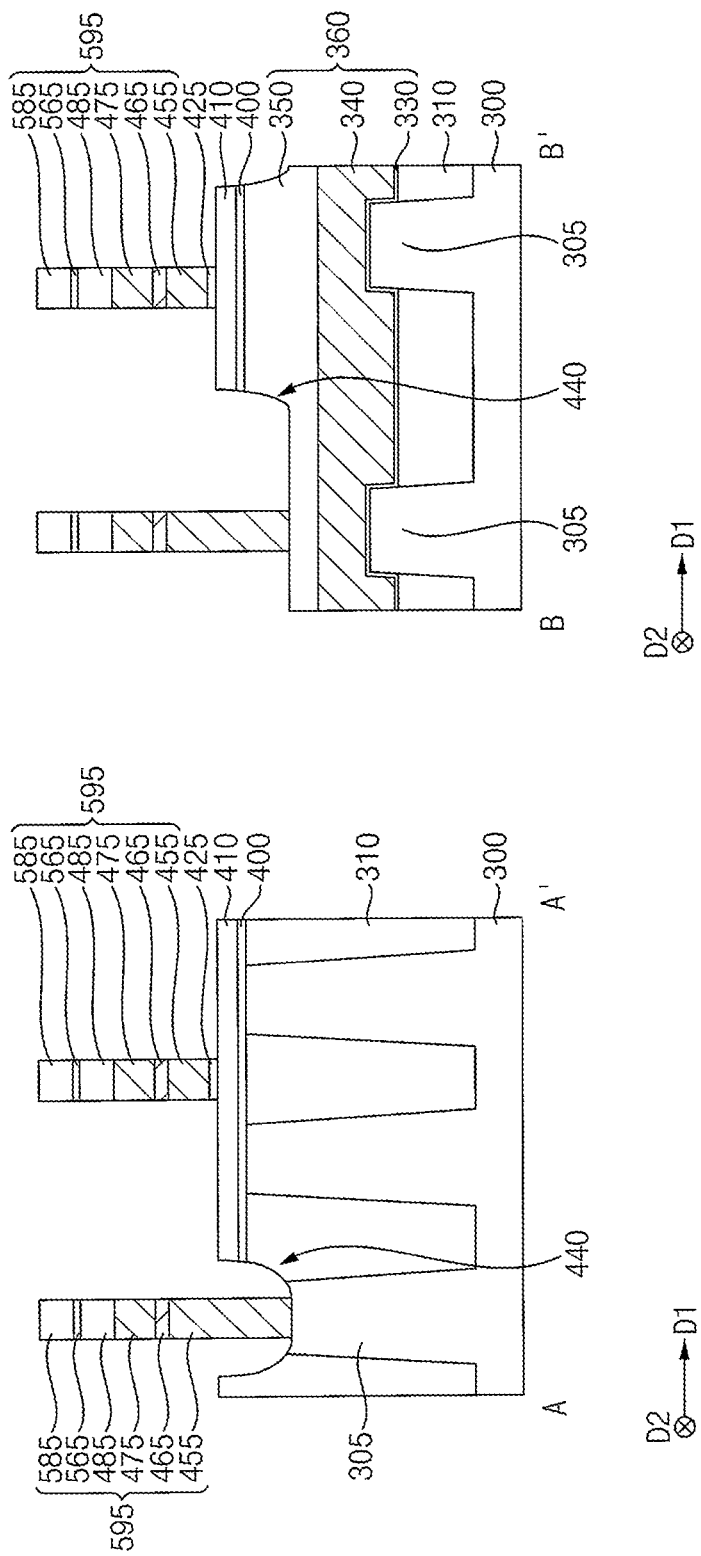

Referring to FIGS. 16 and 17, a first etch stop layer and a first capping layer may be sequentially stacked on the conductive layer structure, the first capping layer may be etched to form a first capping pattern 585, and the first etch stop layer, the fifth mask layer 480, the second conductive layer 470, the first barrier layer 460 and the first conductive layer 450 may be sequentially etched using the first capping pattern 585 as an etching mask. In example embodiments, the first capping pattern 585 may extend in the second direction D2, and a plurality of first capping patterns 585 may be spaced apart from each other in the first direction D1.

By the etching process, a first conductive pattern 455, a first barrier pattern 465, a second conductive pattern 475, a fifth mask 485, a first etch stop pattern 565, and the first capping pattern 585 may be sequentially stacked on the fifth opening 440, and a third insulation pattern 425, the first conductive pattern 455, the first barrier pattern 465, the second conductive pattern 475, the fifth mask 485, the first etch stop pattern 565, and the first capping pattern 585 may be sequentially stacked on the second insulation layer 410 of the insulation layer structure 430 at an outside of the fifth opening 440.

Hereinafter, the first conductive pattern 455, the first barrier pattern 465, the second conductive pattern 475, the fifth mask 485, the first etch stop pattern 565, and the first capping pattern 585 sequentially stacked may be referred to as a bit line structure 595. In example embodiments, the bit line structure 595 may extend in the second direction D2 on the substrate 300, and a plurality of bit line structures 595 may be spaced apart from each other in the first direction D1.

Figure 18:
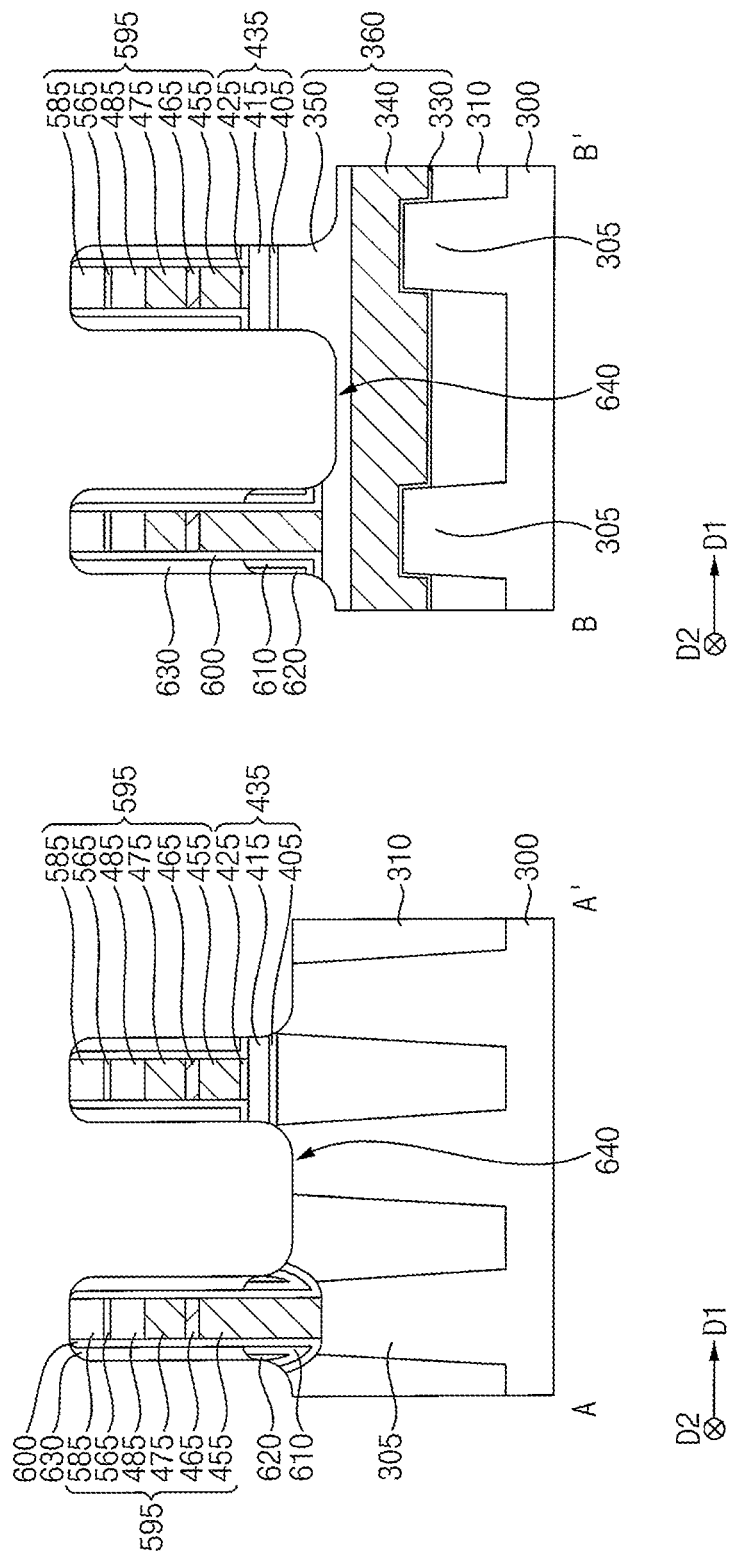

Referring to FIG. 18, a first spacer layer may be formed on the substrate 300 having the bit line structure 595 thereon, and fourth and fifth insulation layers may be sequentially formed on the first spacer layer. The first spacer layer may also cover a sidewall of the third insulation pattern 425 under a portion of the bit line structure 595 on the second insulation layer 410, and the fifth insulation layer may fill a remaining portion of the fifth opening 440.

The first spacer layer may include a nitride, e.g., silicon nitride, the fourth insulation layer may include an oxide, e.g., silicon oxide, and the fifth insulation layer may include a nitride, e.g., silicon nitride.

The fourth and fifth insulation layers may be etched by an etching process. In example embodiments, the etching process may be performed by a wet etching process using phosphoric acid, SC1 and hydrofluoric acid as an etching solution, and other portions of the fourth and fifth insulation layers except for portions of the fourth and fifth insulation layers in the fifth opening 440 may be removed. Thus, most portion of a surface of the first spacer layer, i.e., other portions of the first spacer layer except for the portion thereof in the fifth opening 440, may be exposed, and the portions of the fourth and fifth insulation layers remaining in the fifth opening 440 may form fourth and fifth insulation patterns 610 and 620, respectively.

A second spacer layer may be formed on the exposed surface of the first pacer layer and the fourth and fifth insulation patterns 610 and 620 in the fifth opening 440, and may be anisotropically etched to form a second spacer 630 on the surface of the first spacer layer and the fourth and fifth insulation patterns 610 and 620 to cover a sidewall of the bit line structure 595. The second spacer layer may include an oxide, e.g., silicon oxide.

A dry etching process may be performed using the first capping pattern 585 and the second spacer 630 as an etching mask to form a sixth opening 640 exposing an upper surface of the active pattern 305, and upper surfaces of the isolation pattern 310 and the gate mask 350 may also be exposed by the sixth opening 640. By the dry etching process, a portion of the first spacer layer on the upper surfaces of the first capping pattern 585 and the second insulation layer 410 may be removed, and thus a first spacer 600 may be formed to cover the sidewall of the bit line structure 595. Additionally, during the dry etching process, the first and second insulation layers 400 and 410 may be partially removed, and first and second insulation patterns 405 and 415 may remain under the bit line structure 595. The first to third insulation patterns 405, 415 and 425 sequentially stacked under the bit line structure 595 may form an insulation pattern structure.

Figure 19:
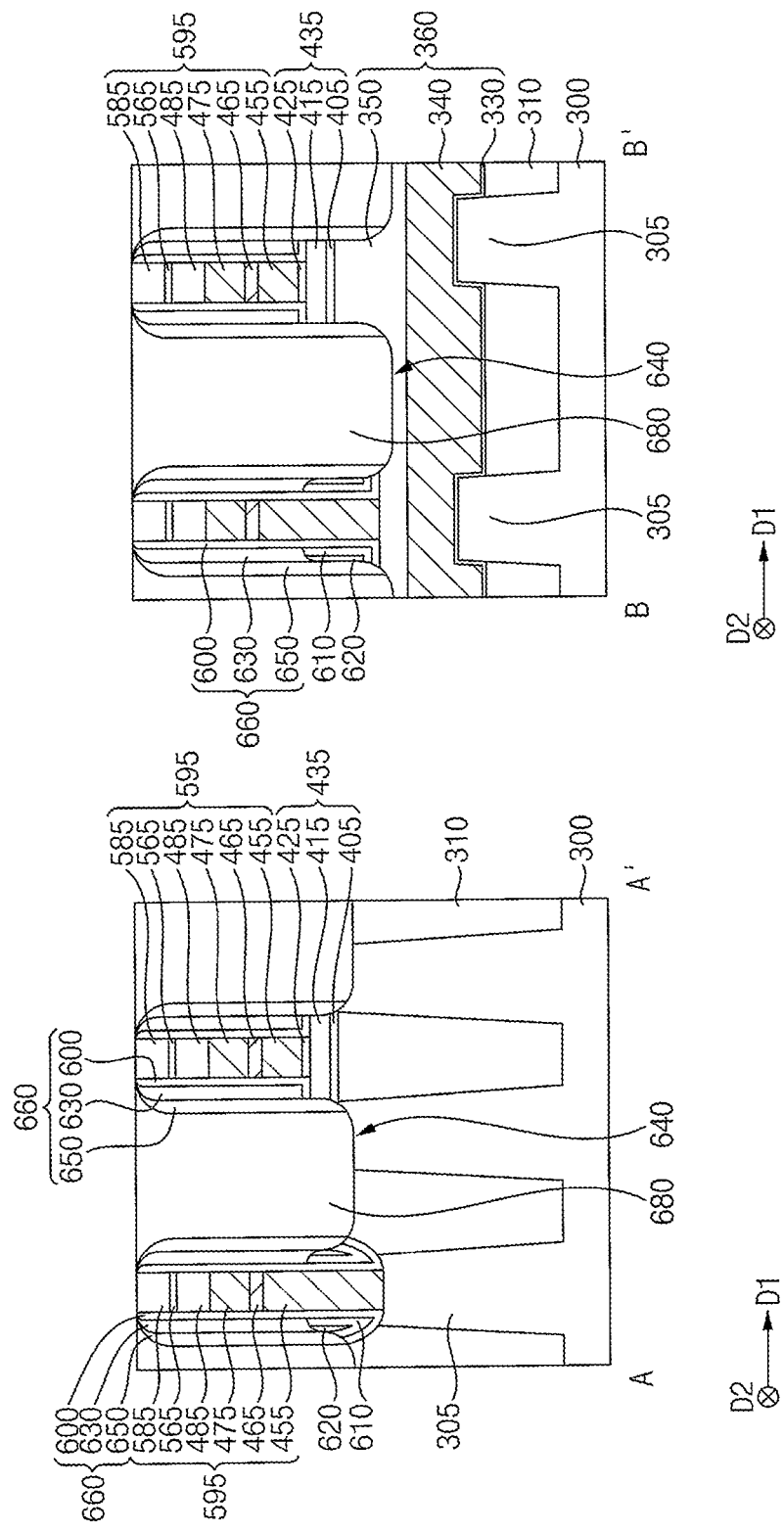

Referring to FIG. 19, a third spacer layer may be formed on the upper surface of the first capping pattern 585, an outer sidewall of the second spacer 630, portions of the upper surfaces of the fourth and fifth insulation patterns 610 and 620, and upper surfaces of the active pattern 305, the isolation pattern 310 and the gate mask 350 exposed by the sixth opening 640, and may be anisotropically etched to form a third spacer 650 covering the sidewall of the bit line structure 595. The third spacer layer may include a nitride, e.g., silicon nitride.

The first to third spacers 600, 630 and 650 sequentially stacked on the sidewall of the bit line structure 595 in a horizontal direction substantially parallel to the upper surface of the substrate 300 may be referred to as a preliminary spacer structure 660.

A second capping pattern 680 may be formed on the substrate 300 to fill the sixth opening 640, and may be planarized until the upper surface of the first capping pattern 585 is exposed. In example embodiments, the second capping pattern 680 may extend in the second direction D2, and a plurality of second capping patterns 680 may be spaced apart from each other in the first direction D1. The second capping pattern 680 may include a nitride, e.g., silicon nitride.

Figure 20:
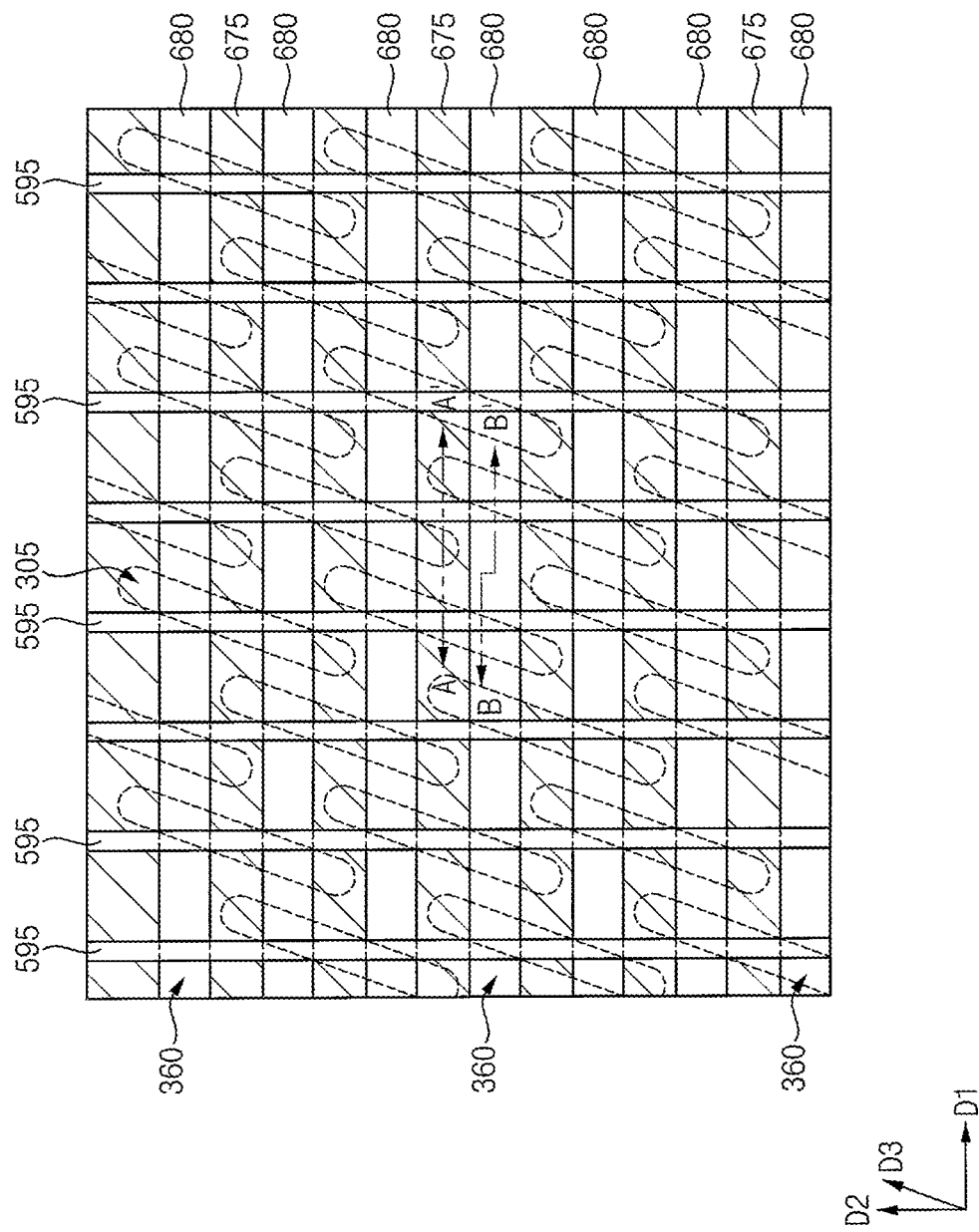
Figure 21:
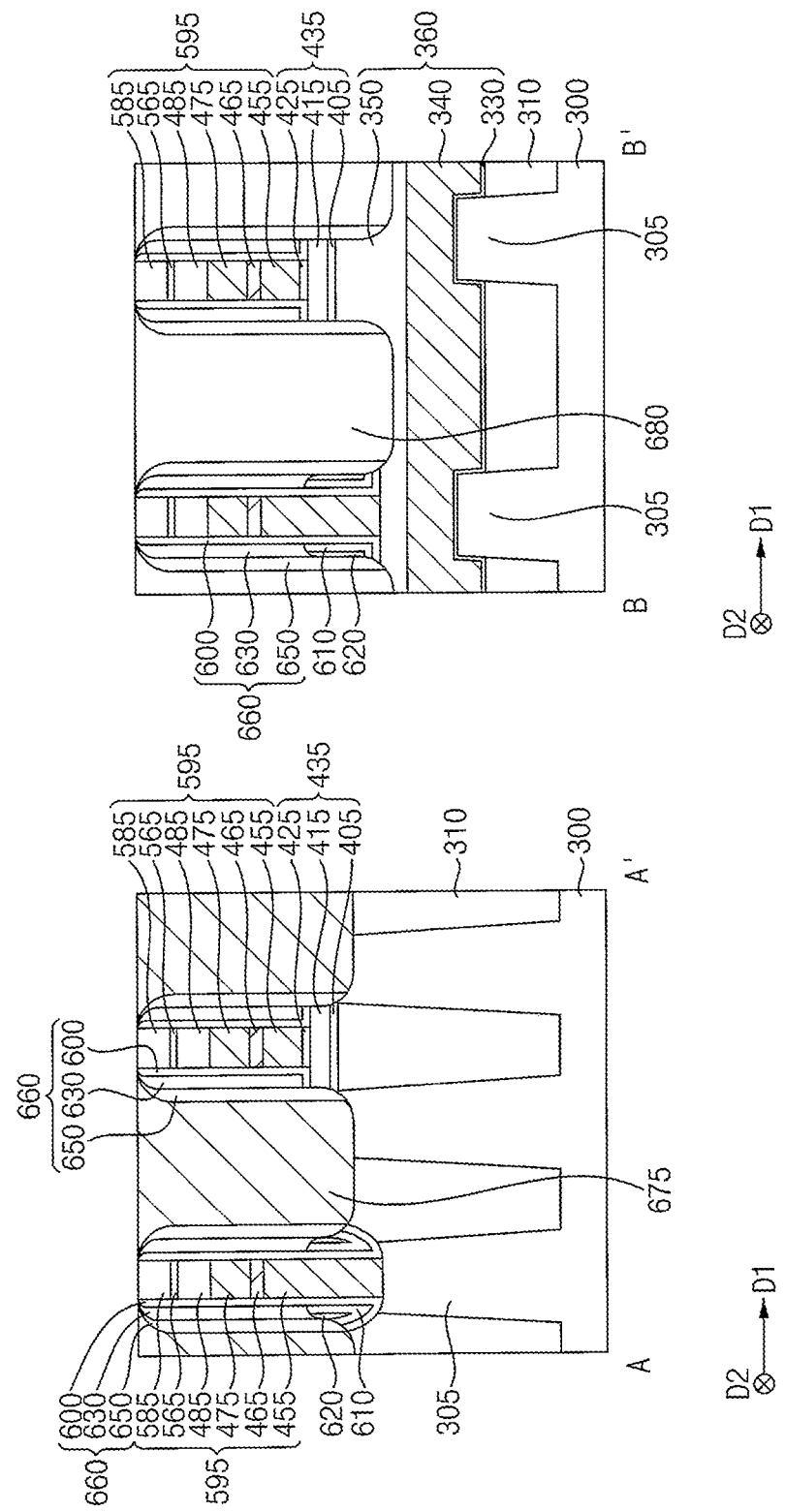

Referring to FIGS. 20 and 21, a sixth mask having a plurality of seventh openings spaced apart from each other in the second direction D2, each of which may extend in the first direction D1, may be formed on the first and second capping patterns 585 and 680, and the second capping pattern 680 may be etched using the sixth mask as an etching mask.

In example embodiments, each of the seventh openings may overlap the gate structure 360 in the vertical direction. By the etching process, an eighth opening exposing an upper surface of the gate mask 350 of the gate structure 360 may be formed between the bit line structures 595.

After removing the sixth mask, a lower contact plug layer may be formed to fill the eighth opening, and may be planarized until the upper surfaces of the first and second capping patterns 585 and 680 are exposed. Thus, the lower contact plug layer may be divided into a plurality of lower contact plugs 675 spaced apart from each other in the second direction D2, each of which may extend in the first direction D1 between the bit line structures 595. Additionally, the second capping pattern 680 extending in the second direction D2 between the bit line structures 595 may be divided into a plurality of parts spaced apart from each other in the second direction D2 by the lower contact plugs 675. The lower contact plug layer 670 may include, e.g., doped polysilicon.

Figure 22:
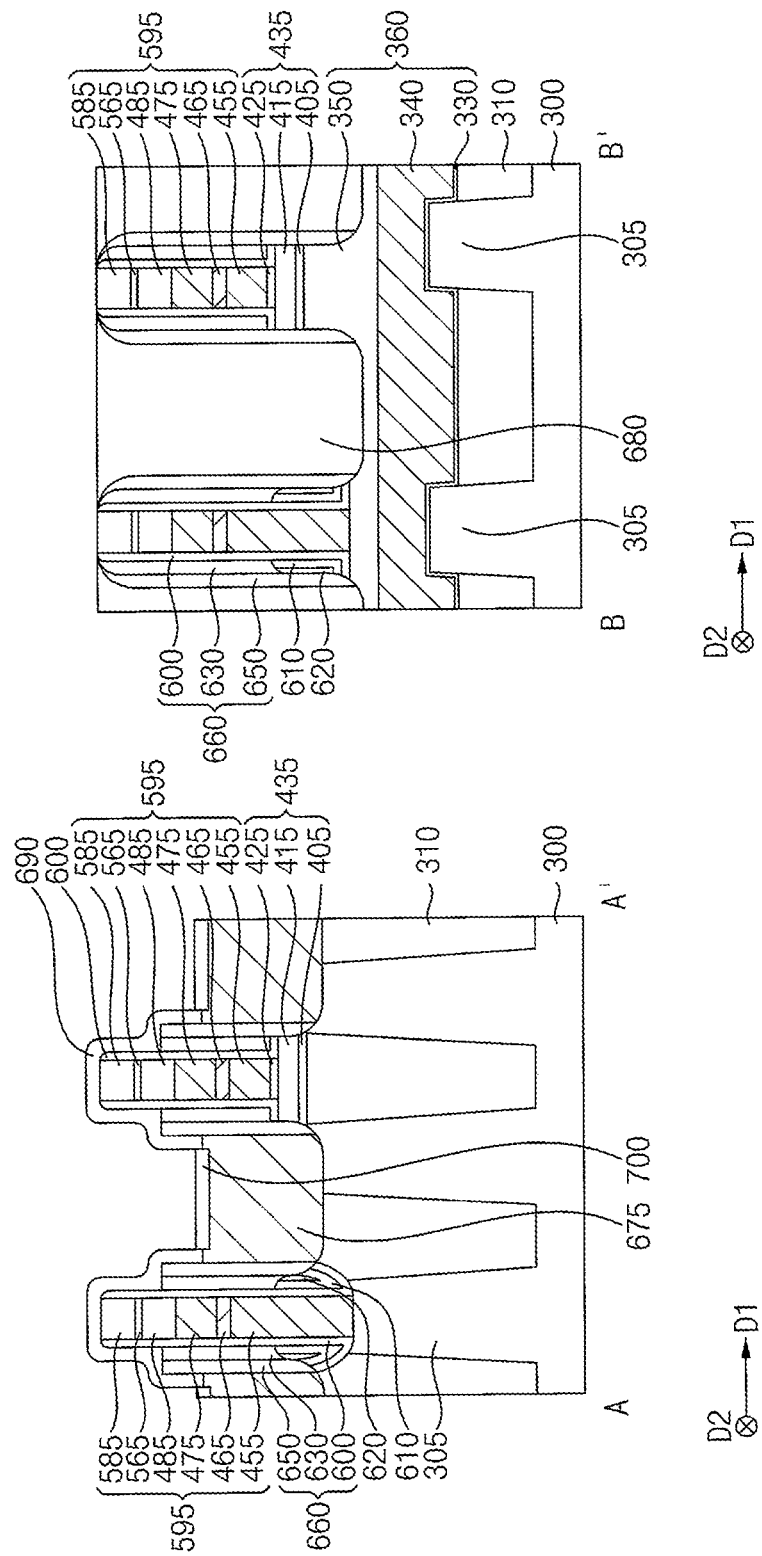

Referring to FIG. 22, an upper portion of the lower contact plug 675 may be removed to expose an upper portion of the preliminary spacer structure 660 on the sidewall of the bit line structure 595, and upper portions of the second and third spacers 630 and 650 of the exposed preliminary spacer structure 660 may be removed.

An upper portion of the lower contact plug 675 may be further removed. Thus, an upper surface of the lower contact plug 675 may be lower than uppermost surfaces of the second and third spacers 630 and 650.

A fourth spacer layer may be formed on the bit line structure 595, the preliminary spacer structure 660, the second capping pattern 680 and the lower contact plug 675, and may be anisotropically etched to form a fourth spacer 690 covering an upper portion of the preliminary spacer structure 660 on each of opposite sidewalls in the first direction D1 of the bit line structure 595, and thus an upper surface of the lower contact plug 675 may be exposed.

A metal silicide pattern 700 may be formed on the exposed upper surface of the lower contact plug 675. In example embodiments, the metal silicide pattern 700 may be formed by forming a first metal layer on the first and second capping patterns 585 and 680, the fourth spacer 690 and the lower contact plug 675, performing a heat treatment on the first metal layer, and removing an unreacted portion of the first metal layer. The metal silicide pattern 700 may include, e.g., cobalt silicide, nickel silicide, titanium silicide, etc.

Figure 23:
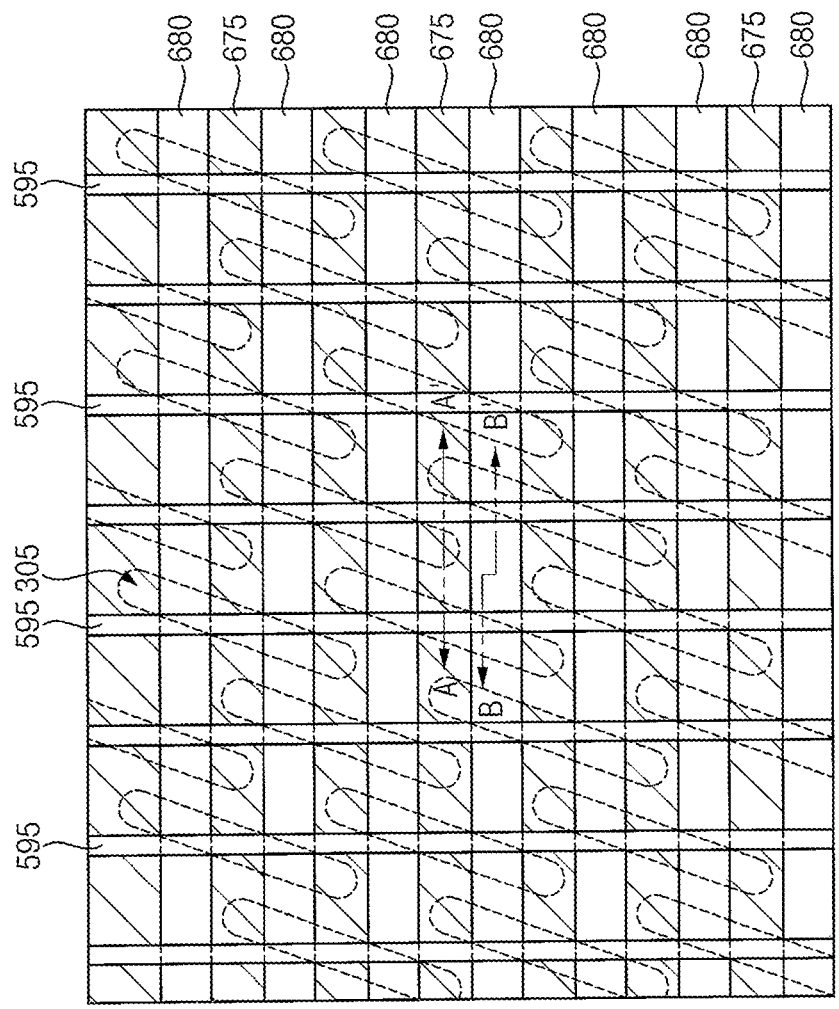
Figure 24:
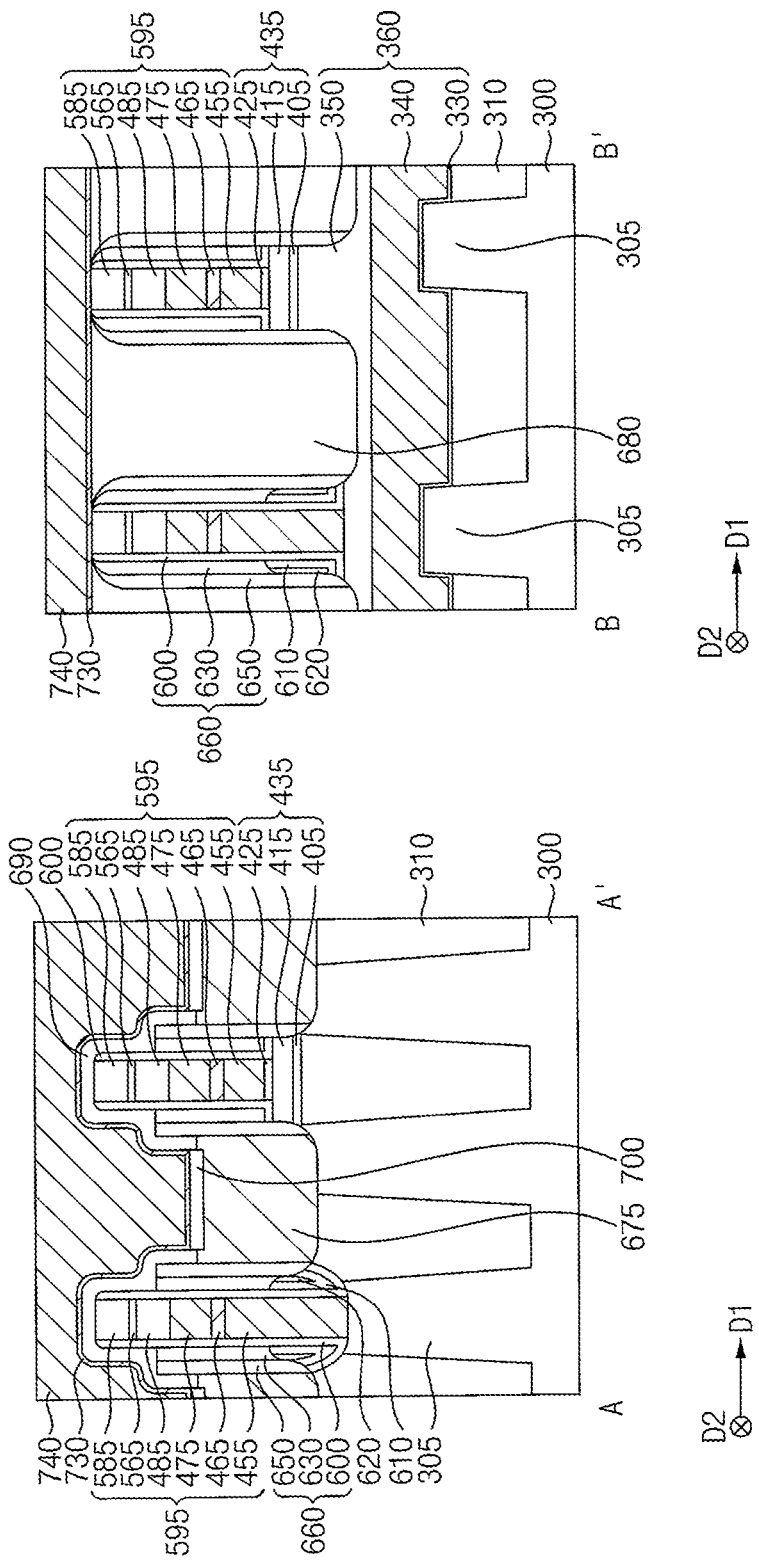

Referring to FIGS. 23 and 24, a second barrier layer 730 may be formed on the first and second capping patterns 585 and 680, the fourth spacer 690, the metal silicide pattern 700 and the lower contact plug 675 on the substrate 300, and a second metal layer 740 may be formed on the second barrier layer 730 to fill a space between the bit line structures 595.

A planarization process may be performed on an upper portion of the second metal layer 740. The planarization process may include a CMP process and/or an etch back process.

Figure 25:
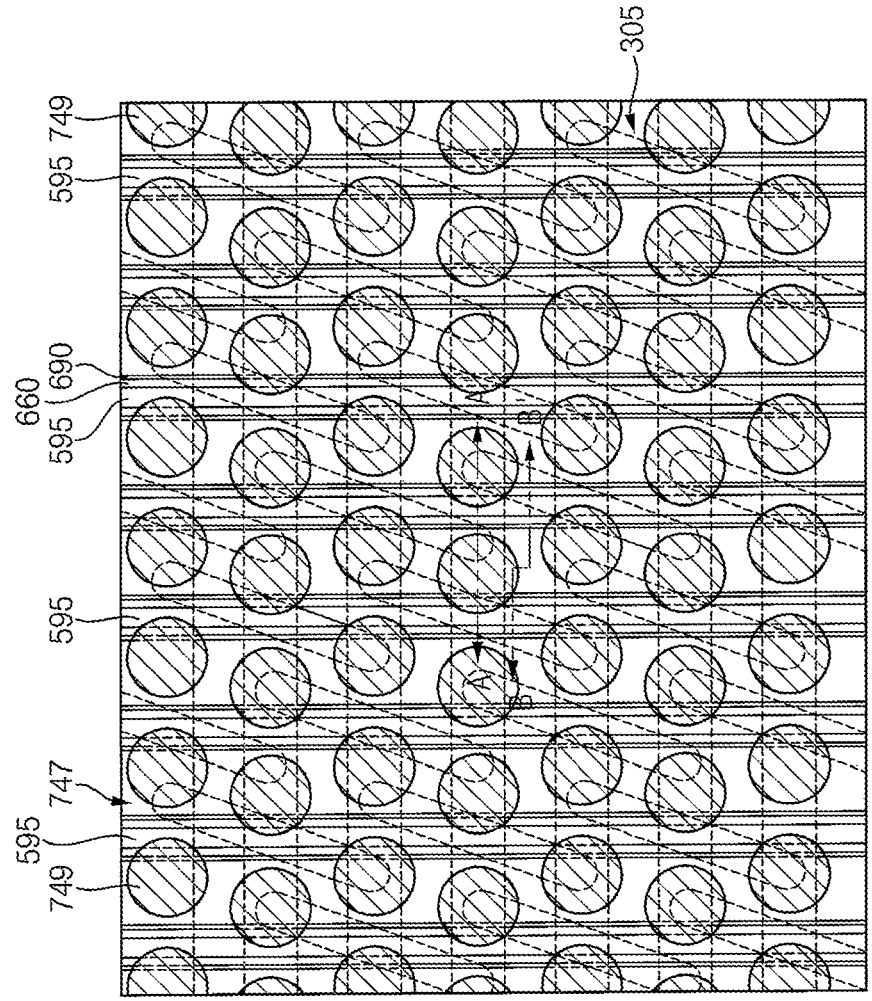
Figure 26:
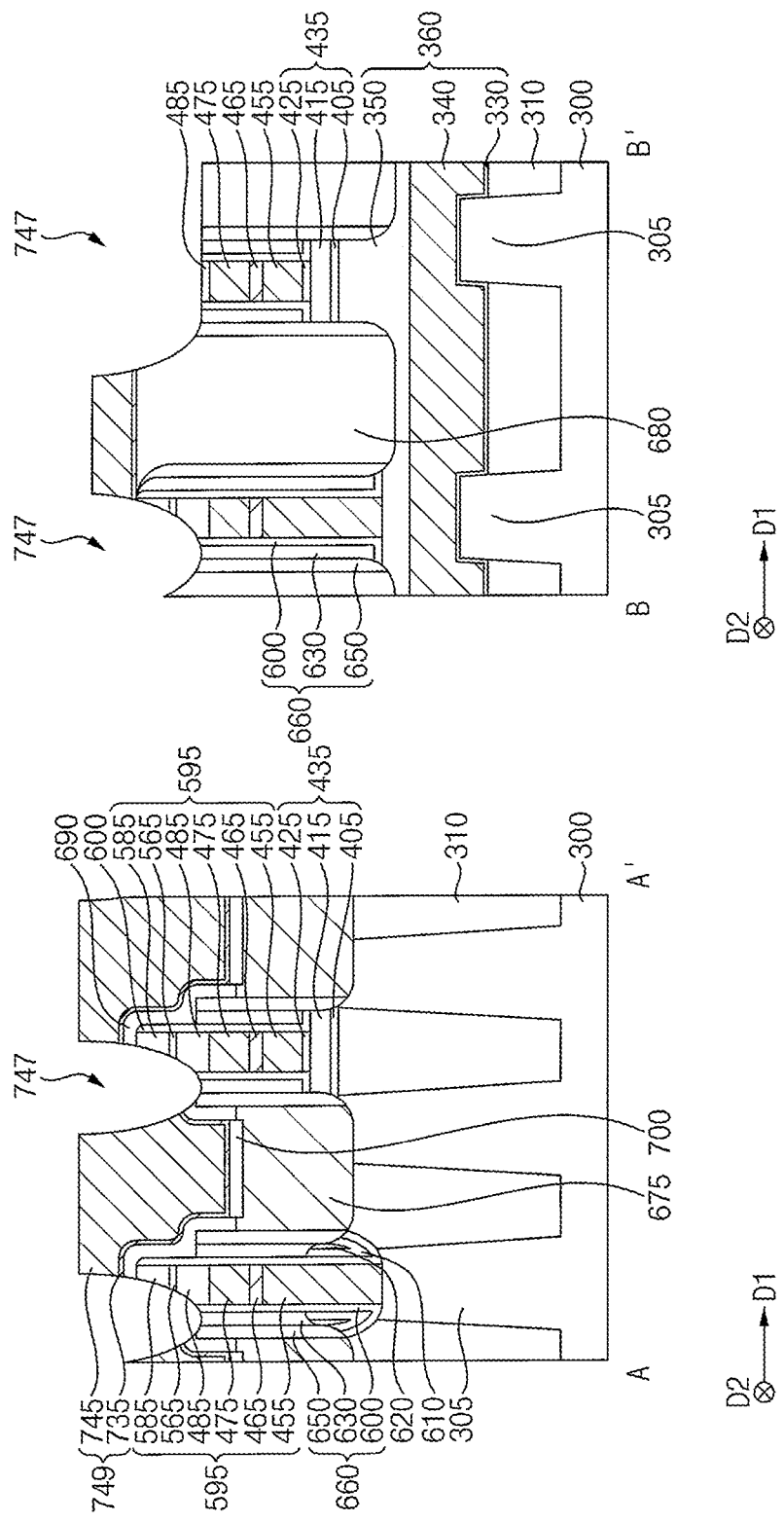

Referring to FIGS. 25 and 26, the second metal layer 740 and the second barrier layer 730 may be patterned to form an upper contact plug 749, and a ninth opening 747 may be formed between the upper contact plugs 749. The ninth opening 747 may be formed by partially removing not only the second metal layer 740 and the second barrier layer 730, but also the first and second capping patterns 585 and 680, the fourth spacer 690, the first etch stop pattern 565 and the fifth mask 485, and thus an upper surface of the second spacer 630 may be exposed.

As the ninth opening 747 is formed, the second metal layer 740 and the second barrier layer 730 may be transformed into a second metal pattern 745 and a second barrier pattern 735, respectively, covering a lower surface and a sidewall of the second metal pattern 745, which may form an upper contact plug 749. In example embodiments, a plurality of upper contact plugs 749 may be spaced apart from each other in the first and second directions D1 and D2, and may be arranged in a honeycomb pattern in a plan view. Each of the upper contact plugs 749 may have a shape of, e.g., a circle, ellipse, or polygon.

The lower contact plug 675, the metal silicide pattern 700 and the upper contact plug 749 sequentially stacked on the substrate 300 may form a contact plug structure.

Figure 27:
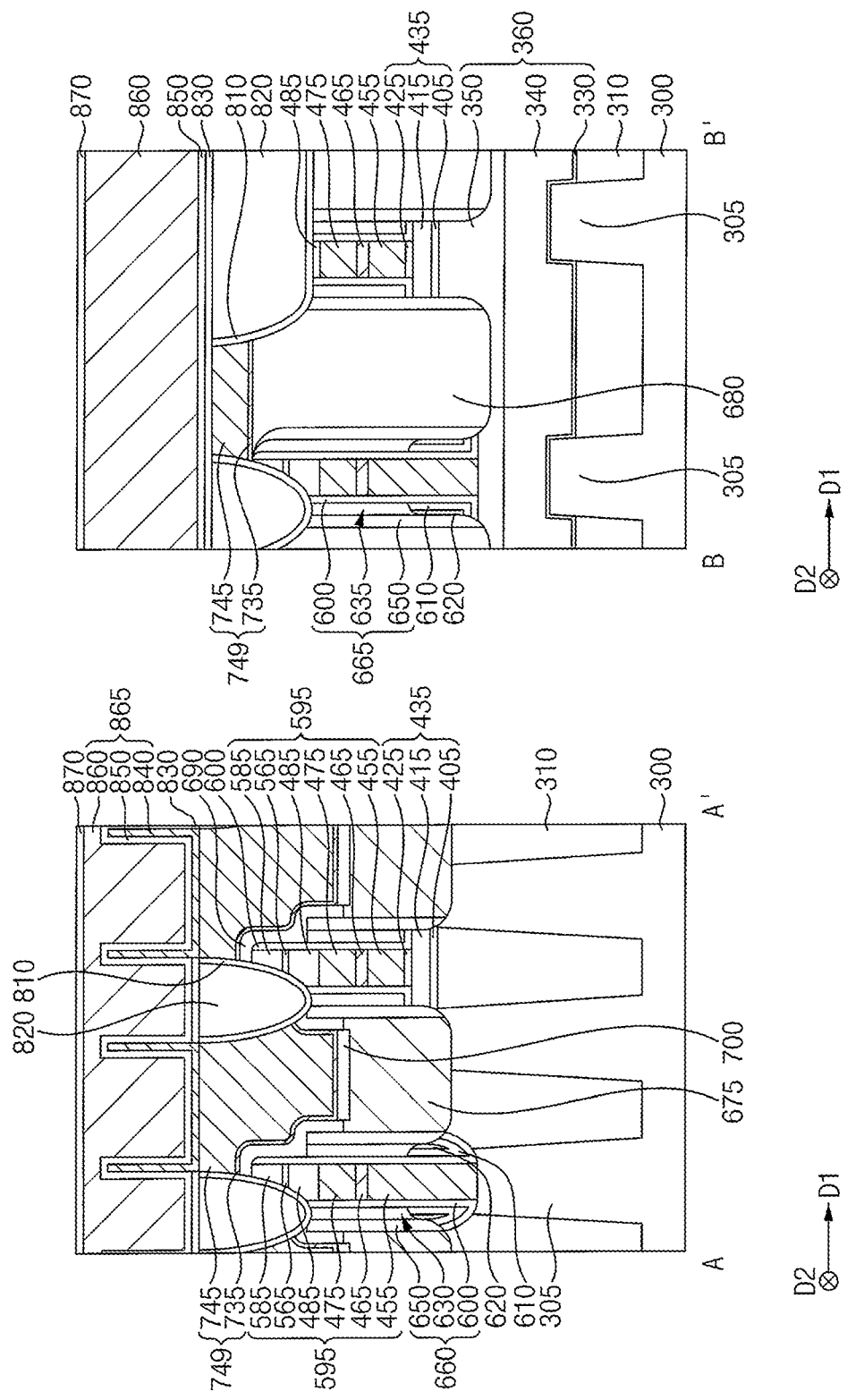

Referring to FIG. 27, the exposed second spacer 630 may be removed to form an air gap 635 connected with the ninth opening 747. The second spacer 630 may be removed by, e.g., a wet etching process.

In example embodiments, in the second spacer 630 on the sidewall of the bit line structure 595 extending in the second direction D2, not only a portion of the second spacer 630 directly exposed by the ninth opening 747 but also a portion thereof parallel to the above portion may be removed. That is, not only a portion of the second spacer 630 exposed by the ninth opening 747 not to be covered by the upper contact plug 749 but also a portion of the second spacer 630 covered by the upper contact plug 649 may be removed. An insulating interlayer structure may be formed to fill the ninth opening 747.

In example embodiments, the insulating interlayer structure may include sixth and seventh insulation layers 810 and 820. The sixth insulation layer 810 may include an insulating material having a low gap-filling characteristic, and thus the air gap 635 under the ninth opening 747 may not be filled. The air gap 635 may be referred to as an air spacer 635, and the first and third spacers 600 and 650 and the air spacer 635 may form a spacer structure 665. The air gap 635 may be a spacer including air. The seventh insulation layer 820 may include an oxide, e.g., silicon oxide or a nitride, e.g., silicon nitride.

A capacitor 865 may be formed to cover an upper surface of the upper contact plug 749. Particularly, a second etch stop layer 830 and a mold layer may be sequentially formed on the upper contact plug 749 and the insulating interlayer structure, and may be partially etched to form a tenth opening partially exposing an upper surface of the upper contact plug 749. A second etch stop layer 830 may include a nitride, e.g., silicon nitride.

A lower electrode layer may be formed on a side of the tenth opening, the exposed upper surface of the upper contact plug 749 and the mold layer, a sacrificial layer may be formed on the lower electrode layer to fill the tenth opening, and the lower electrode layer and the sacrificial layer may be planarized until an upper surface of the mold layer is exposed to divide the lower electrode layer. The sacrificial layer and the mold layer may be removed by, e.g., a wet etching process, and thus a cylindrical lower electrode 840 may be formed on the exposed upper surface of the upper contact plug 749. Alternatively, a pillar shaped lower electrode 840 entirely filling the tenth opening may be formed. The lower electrode 840 may include, e.g., a metal, a metal nitride, a metal silicide, doped polysilicon, etc.

A dielectric layer 850 may be formed on a surface of the lower electrode 840 and the second etch stop layer 830, an upper electrode 860 may be formed on the dielectric layer 850 to form the capacitor 865 include the lower electrode 840, the dielectric layer 850 and the upper electrode 860. The dielectric layer 850 may include, e.g., a metal oxide, the upper electrode 860 may include, e.g., a metal, a metal nitride, a metal silicide, doped poly, etc.

A third etch stop layer 870 may be formed on the capacitor 865. The third etch stop layer 870 may include a nitride, e.g., silicon nitride.

Figure 28:
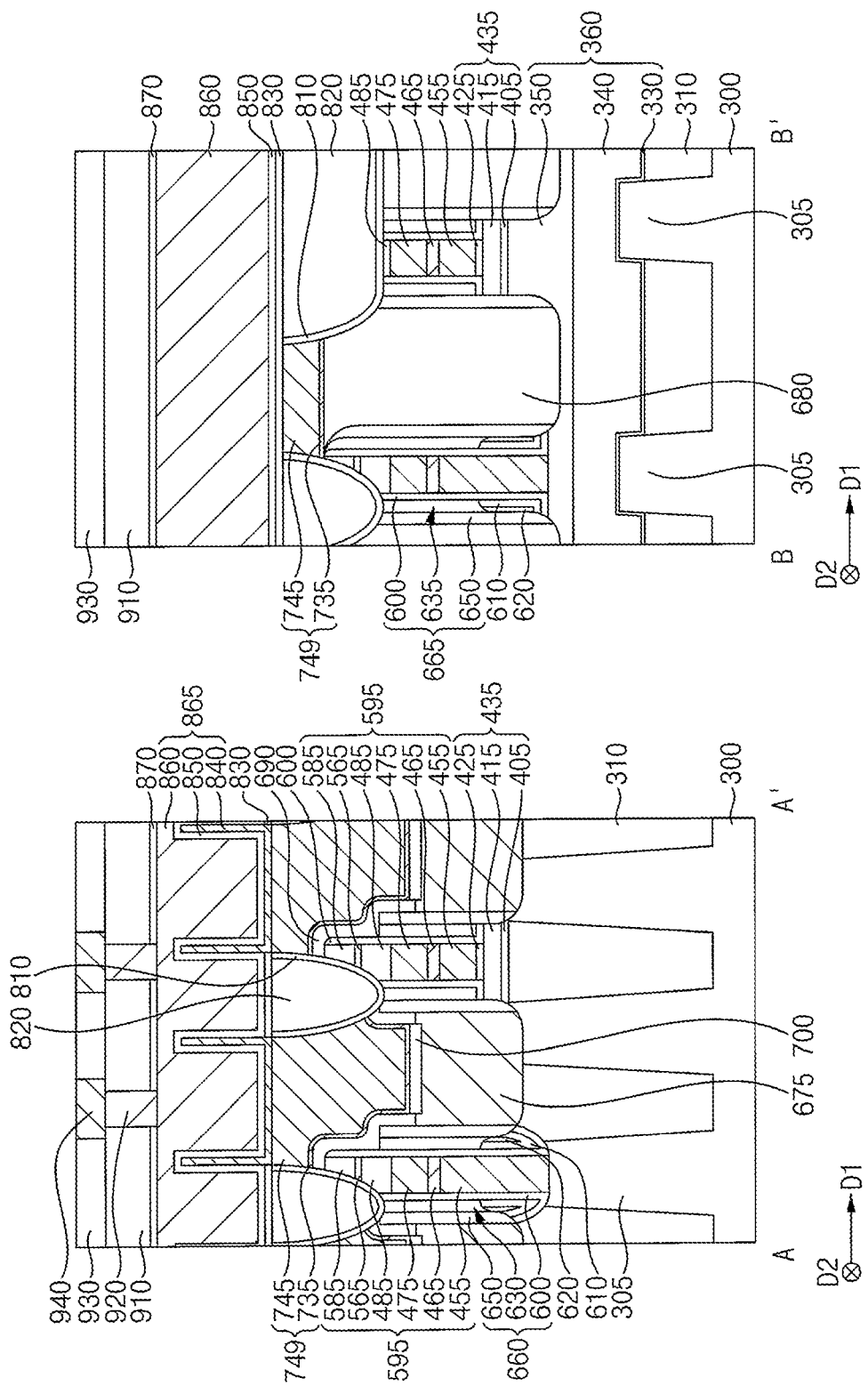

Referring to FIG. 28, a fourth insulating interlayer 910 including an oxide, e.g., silicon oxide may be formed on the third etch stop layer 870, and a contact plug 920 may be formed through the fourth insulating interlayer 910 and the third etch stop layer 870 to contact the upper electrode 860 of the capacitor 865. The contact plug 920 may include, e.g., a metal, a metal nitride, a metal silicide, doped polysilicon, etc.

A fifth insulating interlayer 930 including a low-k dielectric may be formed on the fourth insulating interlayer 910 and the contact plug 920, and a wiring 940 may be formed through the fifth insulating interlayer 930 to contact the contact plug 920. In example embodiments, the wiring 940 may be formed by the method illustrated with reference to FIGS. 1 to 10, and thus the fifth insulating interlayer 930 containing the wiring 940 may have enhanced insulative characteristics.

By way of summation and review, example embodiments provide a method of forming a wiring having improved characteristics. Example embodiments also provide a method of manufacturing a semiconductor device using a method forming a wiring having improved characteristics.

That is, in the method of forming a wiring, the wirings to be spaced apart from each other by short distances in the insulating interlayer may be divided into a plurality of groups. The first openings for forming some of the plurality of groups may be formed through the insulating interlayer by a first etching process, and the second openings for forming others of the plurality of groups may be formed through the insulating interlayer by a second etching process. Before forming second first openings, the protection pattern may be formed on the bottoms and the sides of the first openings, so that the portions of the insulating interlayer adjacent to the first openings may not be damaged during the ashing process after the second etching process. Accordingly, the insulating interlayer may be less damaged, so as to have enhanced insulating characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method for forming a wiring, the method comprising:
   forming an insulating interlayer on a substrate, the insulating interlayer including a low-k dielectric material;
   forming a first etching mask on the insulating interlayer;
   performing a first etching process using the first etching mask to form a first opening through the insulating interlayer;
   removing the first etching mask;
   forming a protection pattern on a bottom and a side of the first opening;
   forming a second etching mask on the protection pattern and the insulating interlayer;
   performing a second etching process using the second etching mask to form a second opening through the insulating interlayer;
   removing the second etching mask;
   removing the protection pattern; and
   forming the wiring in each of the first and second openings.

2. The method as claimed in claim 1, wherein removing the first etching mask includes performing an ashing process.

3. The method as claimed in claim 2, wherein the ashing process is performed using oxygen plasma.

4. The method as claimed in claim 1, wherein the low-k dielectric material includes carbon.

5. The method as claimed in claim 1, wherein the protection pattern includes a metal nitride.

6. The method as claimed in claim 5, wherein removing the protection pattern includes performing a wet etching process.

7. The method as claimed in claim 1, wherein forming the protection pattern includes:
   forming a protection layer on the bottom and the side of the first opening;
   forming a filling layer to fill a remaining portion of the first opening;
   planarizing the filling layer until an upper surface of the protection layer is exposed to form a filling pattern; and
   removing an exposed portion of the protection layer by a wet etching process.

8. The method as claimed in claim 7, wherein:
   the second etching mask is formed on the protection pattern, the insulating interlayer, and the filling pattern, and
   the filling pattern is also removed when the second etching mask is removed.

9. The method as claimed in claim 1, wherein removing the second etching mask includes performing an ashing process.

10. The method as claimed in claim 1, wherein each of the first and second etching masks includes a spin-on hardmask or an amorphous carbon layer.

11. A method for forming a wiring, the method comprising:
   forming an insulating interlayer on a substrate;
   forming a first etching mask on the insulating interlayer;
   performing a first etching process using the first etching mask to form first openings through the insulating interlayer, the first openings being spaced apart from each other;
   removing the first etching mask by an ashing process;
   forming a protection pattern on a bottom and a side of each of the first openings;
   forming a second etching mask on the protection pattern and the insulating interlayer;

performing a second etching process using a second etching mask to form a second opening through the insulating interlayer, the second opening being disposed between the first openings;

removing the second etching mask by an ashing process;

removing the protection pattern; and forming the wiring in each of the first and second openings.

12. The method as claimed in claim 11, wherein the insulating interlayer includes a low-k dielectric material containing carbon, and the ashing process is performed using oxygen plasma.

13. The method as claimed in claim 11, wherein the protection pattern includes a metal nitride.

14. The method as claimed in claim 11, wherein removing the protection pattern includes performing a wet etching process.

15. The method as claimed in claim 11, wherein forming the protection pattern includes:

forming a protection layer on the bottom and the side of the first openings;

forming a filling layer to fill a remaining portion of the first openings;

planarizing the filling layer until an upper surface of the protection layer is exposed to form a filling pattern; and removing an exposed portion of the protection layer by a wet etching process.

16. The method as claimed in claim 15, wherein:

the second etching mask is formed on the protection pattern, the insulating interlayer, and the filling pattern, and the filling pattern is also removed when the second etching mask is removed.

17. The method as claimed in claim 16, wherein each of the second etching mask and the filling pattern includes a spin-on hardmask or an amorphous carbon layer.

18. A method for manufacturing a semiconductor device, the method comprising:

forming a buried gate structure in an upper portion of a substrate;

forming a bit line structure on the substrate;

forming a contact plug structure adjacent to the bit line structure on the substrate;

forming a capacitor on the contact plug structure; and forming a wiring to be electrically connected to the capacitor, wherein forming the wiring includes:

forming a first insulating interlayer on the capacitor, the first insulating interlayer including a low-k dielectric material, forming a first etching mask on the first insulating interlayer, performing a first etching process using the first etching mask to form a first opening through the first insulating interlayer, removing the first etching mask, forming a protection pattern on a bottom and a side of the first opening, forming a second etching mask on the protection pattern and the first insulating interlayer, performing a second etching process using a second etching mask to form a second opening through the first insulating interlayer, removing the second etching mask, removing the protection pattern, and forming the wiring in each of the first and second openings.

19. The method as claimed in claim 18, further comprising forming an isolation pattern on the substrate to define an active pattern on the substrate, such that the gate structure is formed to be buried in upper portions of the active pattern and the isolation pattern.

20. The method as claimed in claim 18, further comprising, prior to forming the first insulating interlayer:

forming a second insulating interlayer on the capacitor; and forming contact plugs through the second insulating interlayer to contact the capacitor, such that each of the first and second openings extends through the first insulating interlayer to expose upper surfaces of the contact plugs.

* * * * *